(12) United States Patent
Lee et al.

(10) Patent No.: US 12,171,122 B2
(45) Date of Patent: Dec. 17, 2024

(54) DISPLAY PANEL AND DISPLAY APPARATUS INCLUDING THE SAME

(71) Applicant: Samsung Display Co., Ltd., Yongin-si (KR)

(72) Inventors: Jaesung Lee, Yongin-si (KR); Jun Namkung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 443 days.

(21) Appl. No.: 17/707,102

(22) Filed: Mar. 29, 2022

(65) Prior Publication Data

US 2023/0036991 A1 Feb. 2, 2023

(30) Foreign Application Priority Data

Jul. 29, 2021 (KR) .................. 10-2021-0100135

(51) Int. Cl.
*H01L 27/32* (2006.01)
*H10K 59/121* (2023.01)
*H10K 59/131* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216; H10K 59/8731; H10K 59/124; H10K 59/123; H10K 59/121; H01L 27/1214
USPC .......................................................... 257/40
See application file for complete search history.

(56) References Cited

U.S. PATENT DOCUMENTS

| 10,431,636 | B2 | 10/2019 | Rappoport et al. |
| 2019/0393286 | A1 | 12/2019 | Ding et al. |
| 2021/0193758 | A1 | 6/2021 | Choi et al. |
| 2021/0193782 | A1 | 6/2021 | Seo et al. |
| 2022/0059633 | A1* | 2/2022 | Kang .................. H10K 59/131 |

FOREIGN PATENT DOCUMENTS

| CN | 110874990 | 3/2020 |
| CN | 111180494 | 5/2020 |
| CN | 111710276 | 9/2020 |
| CN | 112186021 | 1/2021 |

* cited by examiner

*Primary Examiner* — Tong-Ho Kim
(74) *Attorney, Agent, or Firm* — KILE PARK REED & HOUTTEMAN PLLC

(57) ABSTRACT

A display panel includes a substrate including a first display area, a second display area, a first display element in the first display area, and a second display element in the second display area; a first pixel circuit in the first display area and electrically connected to the first display element; a second pixel circuit arranged outside the second display area and electrically connected to the second display element; an inorganic insulating layer arranged over the substrate and including a groove corresponding to the second display area; and a connection wiring arranged inside the groove and electrically connecting the second display element to the second pixel circuit, wherein the connection wiring and at least one of conductive layers of the second pixel circuit include a same material, and the connection wiring includes portions having different widths depending on a position of the connect wiring arranged in the second display area.

20 Claims, 16 Drawing Sheets

DISPLAY PANEL AND DISPLAY APPARATUS INCLUDING THE SAME

CROSS-REFERENCE TO RELATED APPLICATION

This application is based on and claims priority to and the benefit of Korean Patent Application No. 10-2021-0100135 under 35 U.S.C. § 119, filed on Jul. 29, 2021, in the Korean Intellectual Property Office (KIPO), the entire contents of which are incorporated herein by reference.

BACKGROUND

1. Technical Field

One or more embodiments relate to a display panel and a display apparatus including the display panel, and more particularly, to a display panel with an extended display area in which images may be displayed even in a region where a component as an electronic element is arranged, and a display apparatus including the display panel.

2. Description of the Related Art

Recently, the usage of display apparatuses has diversified. In addition, as display apparatuses have become thinner and lighter, their range of use has gradually been extended.

As display apparatuses are utilized variously, there may be various methods in designing the shape of display apparatuses, and functions that are combined or associated with display apparatuses have increased.

SUMMARY

One or more embodiments include a display panel with an extended display area in which images may be displayed even in a region where a component as an electronic element is arranged, and a display apparatus including the display panel. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display panel may include a substrate including a first display area, a second display area, a first display element being arranged in the first display area, and a second display element being arranged in the second display area, a first pixel circuit arranged in the first display area and electrically connected to the first display element, a second pixel circuit arranged outside the second display area and electrically connected to the second display element, an inorganic insulating layer arranged over the substrate and including a groove corresponding to the second display area, and a connection wiring arranged inside the groove and electrically connecting the second display element to the second pixel circuit. The connection wiring and at least one of conductive layers of the second pixel circuit may include a same material, and the connection wiring may include portions having different widths depending on a position of the connection wiring arranged in the second display area.

The display panel may further include an organic insulating layer arranged on the connection wiring and filling the groove.

The second pixel circuit may include a first thin-film transistor including a first gate electrode, and a first semiconductor layer including a silicon semiconductor. The connection wiring and the first gate electrode may be arranged on a same layer and may include a same material.

The second pixel circuit may include a first thin-film transistor including a first gate electrode, and a first semiconductor layer including a silicon semiconductor, and a storage capacitor including a lower electrode and an upper electrode, the lower electrode and the first gate electrode being integral with each other, and the upper electrode being disposed over the lower electrode. The connection wiring and the upper electrode may include a same material and may be arranged on a same layer.

The second pixel circuit may include a first thin-film transistor including a first gate electrode, and a first semiconductor layer including a silicon semiconductor, and a second thin-film transistor including a second gate electrode and a second semiconductor layer, the second gate electrode being arranged on a layer different from the first gate electrode, and the second semiconductor layer including an oxide semiconductor. The connection wiring and the second gate electrode may include a same material and may be arranged on a same layer.

The second pixel circuit may include a first thin-film transistor including a first gate electrode, a first source electrode, a first drain electrode, and a first semiconductor layer, the first semiconductor layer including a silicon semiconductor. The connection wiring and the first source electrode may include a same material.

The second pixel circuit may include a first thin-film transistor including a first gate electrode, a first source electrode, a first drain electrode, and a first semiconductor layer, the first semiconductor layer including a silicon semiconductor. The connection wiring may include a first conductive layer and a second conductive layer that are stacked, the first conductive layer and the first gate electrode may include a same material, and the second conductive layer and the first source electrode may include a same material.

The second display area may include a first sub-area, a second sub-area, and a third sub-area, the first sub-area being arranged in an edge of the second display area, the third sub-area being spaced apart from the first sub-area, and the second sub-area being disposed between the first sub-area and the third sub-area. A portion of the connection wiring arranged in the first sub-area may have a first width, a portion of the connection wiring arranged in the second sub-area may have a second width, a portion of the connection wiring arranged in the third sub-area may have a third width, and the third width may be greater than the second width, and the second width may be greater than the first width.

The display panel may further include third display areas respectively arranged on a right side and a left side of the second display area. The second pixel circuit may be arranged in the third display area, and the connection wiring may extend from the third display area to the second display area.

The display panel may further include a peripheral area arranged over the second display area. The second pixel circuit may be arranged in the peripheral area, and the connection wiring may extend from the peripheral area to the second display area.

The substrate may further include a fourth display area spaced apart from the second display area and in which a fourth display element is arranged. The display panel may further include a fourth pixel circuit arranged outside the fourth display area and electrically connected to the fourth display element, and an additional connection wiring electrically connecting the fourth display element to the fourth pixel circuit. The additional connection wiring may be different from the connection wiring in at least one of a shape and a material.

A width of the additional connection wiring may be constant in the fourth display area.

The substrate may further include an opening area arranged inside the first display area, and the opening area may not display an image.

According to one or more embodiments, a display apparatus includes a display panel including a first display area, a second display area, a first display element being arranged in the first display area, and a second display element being arranged in the second display area, and a component arranged below the display panel to correspond to the second display area, wherein the display panel includes a substrate, a first pixel circuit arranged in the first display area and electrically connected to the first display element, a second pixel circuit arranged outside the second display area and electrically connected to the second display element, an inorganic insulating layer arranged over the substrate and including a groove corresponding to the second display area, and a connection wiring arranged inside the groove and electrically connecting the second display element to the second pixel circuit. The connection wiring and at least one of conductive layers of the second pixel circuit may include a same material, and the connection wiring includes portions having different widths depending on a position of the connection wiring arranged in the second display area.

The display apparatus may further include an organic insulating layer arranged on the connection wiring and filling the groove.

The second pixel circuit may include a thin-film transistor including a gate electrode, and a semiconductor layer, the semiconductor layer including a silicon semiconductor. The connection wiring and the gate electrode may be arranged on a same layer and may include a same material.

The second pixel circuit may include a thin-film transistor including a gate electrode, a source electrode, a drain electrode, and a semiconductor layer, the semiconductor layer including a silicon semiconductor. The connection wiring may include a first conductive layer and a second conductive layer that are stacked, the first conductive layer and the gate electrode including a same material, and the second conductive layer and the source electrode including a same material.

The second display area may include a first sub-area, a second sub-area, and a third sub-area, the first sub-area being arranged in an edge of the second display area, the third sub-area being spaced apart from the first sub-area, and the second sub-area being disposed between the first sub-area and the third sub-area. A portion of the connection wiring arranged in the first sub-area may have a first width, a portion of the connection wiring arranged in the second sub-area may have a second width, a portion of the connection wiring arranged in the third sub-area may have a third width, the third width may be greater than the second width, and the second width may be greater than the first width.

The display panel may further include a fourth display area spaced apart from the second display area, and an additional component arranged below the display panel to correspond to the fourth display area. The additional connection wiring arranged in the fourth display area may be different from the connection wiring in at least one of a shape and a material.

A width of the additional connection wiring may be constant in the fourth display area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
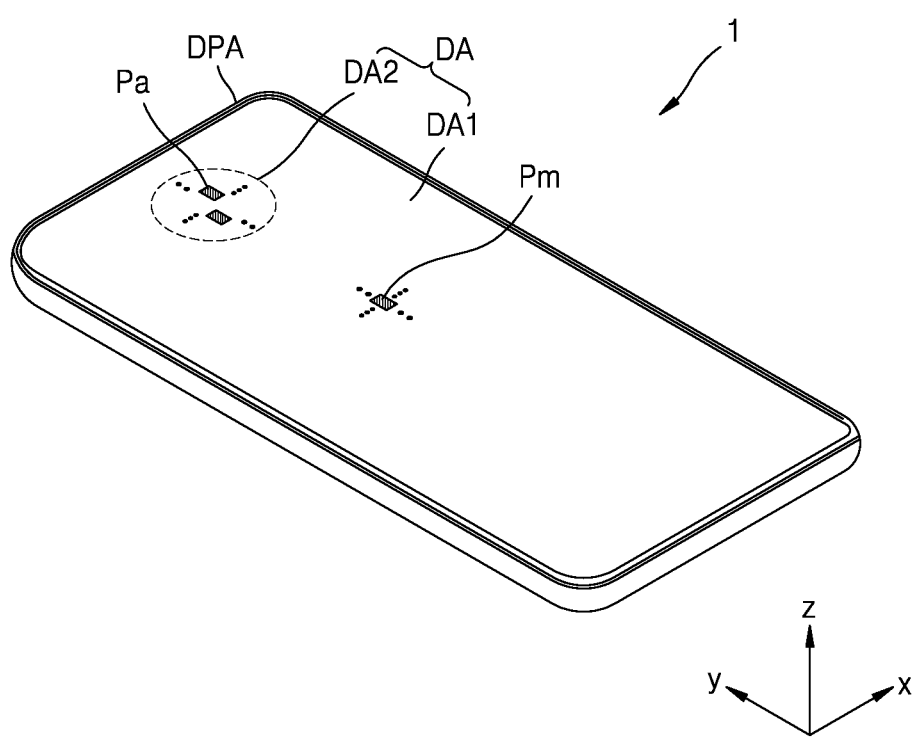
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

It will be understood that, when a layer, region, or component is referred to as being "on" another layer, region, or component, it can be directly or indirectly on the other layer, region, or component. That is, for example, intervening layers, regions, or components may be present. Sizes of elements in the drawings may be exaggerated or reduced for convenience of explanation. For example, since sizes and thicknesses of elements in the drawings are arbitrarily illustrated for convenience of explanation, the disclosure is not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view of a display apparatus 1 according to an embodiment.

Referring to FIG. 1, the display apparatus 1 includes a display area DA and a peripheral area DPA outside the display area DA. The display area DA may include a first display area DA1 and a second display area DA2. The first display area DA1 may surround at least a portion of the second display area DA2. The first display area DA1 may be a main display area, and the second display area DA2 may be both a component area and an auxiliary display area, and a component may be arranged in the component area. For example, the first display area DA1 and the second display area DA2 may be configured to display an image individually or in cooperation with each other. The peripheral area DPA may be a kind of non-display area in which display elements are not arranged. The display area DA may be surrounded by the peripheral area DPA entirely.

FIG. 1 illustrates that a second display area DA2 is arranged inside the first display area DA1, and a component is arranged in the second display area DA2. In an embodiment, the display apparatus 1 may include two or more second display areas DA2. of the shape and size of the second display areas DA2 may be different from each other.

When viewed in a direction approximately perpendicular to the upper surface of the display apparatus 1, the shape of the second display area DA2 may include various shapes such as a circular shape, an elliptical shape, a polygon including a quadrangle, a star shape, a diamond shape, and the like. Although FIG. 1 illustrates that the second display area DA2 is arranged in an upper right side (in a y direction) of the first display area DA1 approximately having a quadrangular shape when viewed in a direction approximately perpendicular to the upper surface of the display apparatus 1, the second display area DA2 may be arranged on a side of the first display area DA1 having a quadrangular shape, for example, the upper right side or upper left side thereof.

The display apparatus 1 may provide images by using pixels. The pixel may include a sub-pixel that may be configured to display red, green, or blue. The pixel may include a set of sub-pixels.

A sub-pixel may be implemented by an emission area of a display element. A display element may include a pixel electrode (an anode), an opposite electrode (a cathode), and an emission layer between the pixel electrode and the opposite electrode. The emission area may be defined as a region from which the emission layer emits light. In an embodiment, the emission area may be defined as an opening area of a pixel-defining layer covering the edges of the pixel electrode and exposing a central portion of the pixel electrode. Likewise, a sub-pixel may be defined as the opening area of the pixel-defining layer.

The emission layer may include an organic material that may substantially display red, green, or blue. The emission layer may include the emission area and a non-emission area, the emission area being configured to actually emit light, and the non-emission area being configured not to emit light depending on an area in which a first electrode (the anode) overlaps a second electrode (the cathode).

In the specification, a pixel may be used as the same concept as a sub-pixel. For example, a pixel may be implemented as an emission area of a display element. Depending on the case, a pixel or a sub-pixel may be used as the same concept as a display element.

The display apparatus 1 may be configured to display images by using first pixels Pm arranged in the first display area DA1, and second pixels Pa arranged in the second display area DA2.

The second pixels Pa may be arranged in the second display area DA2. The second pixels Pa may be configured to display images by emitting light. Images displayed in the second display area DA2 are auxiliary images and may have a less resolution than that of images displayed in the first display area DA1.

A component 40 (see FIG. 2), which is an electronic element, may be arranged in the second display area DA2 below a display panel. The component 40 is a camera that uses an infrared ray or visible light and may include a photographing or imaging element. As another example, the component 40 may be a solar battery, a flash, an illuminance sensor, a proximity sensor, or an iris sensor. As another example, the component 40 may have a function of receiving sound. To prevent the function of the component 40 from being limited, a second pixel circuit driving the second pixel Pa in the second display area DA2 may be arranged in a third area AR3 instead of in the second display area DA2. In an embodiment, the third area AR3 may be the peripheral area DPA. In an embodiment, the third area AR3 may be a display area arranged between the first display area DA1 and the second display area DA2 and configured to display images.

In the display panel and a display apparatus including the display panel according to an embodiment, in case that light passes through the second display area DA2, a light transmittance may be about 10% or more, more preferably about 40% or more, about 25% or more, about 50% or more, about 85% or more, or about 90% or more.

Figure 2:
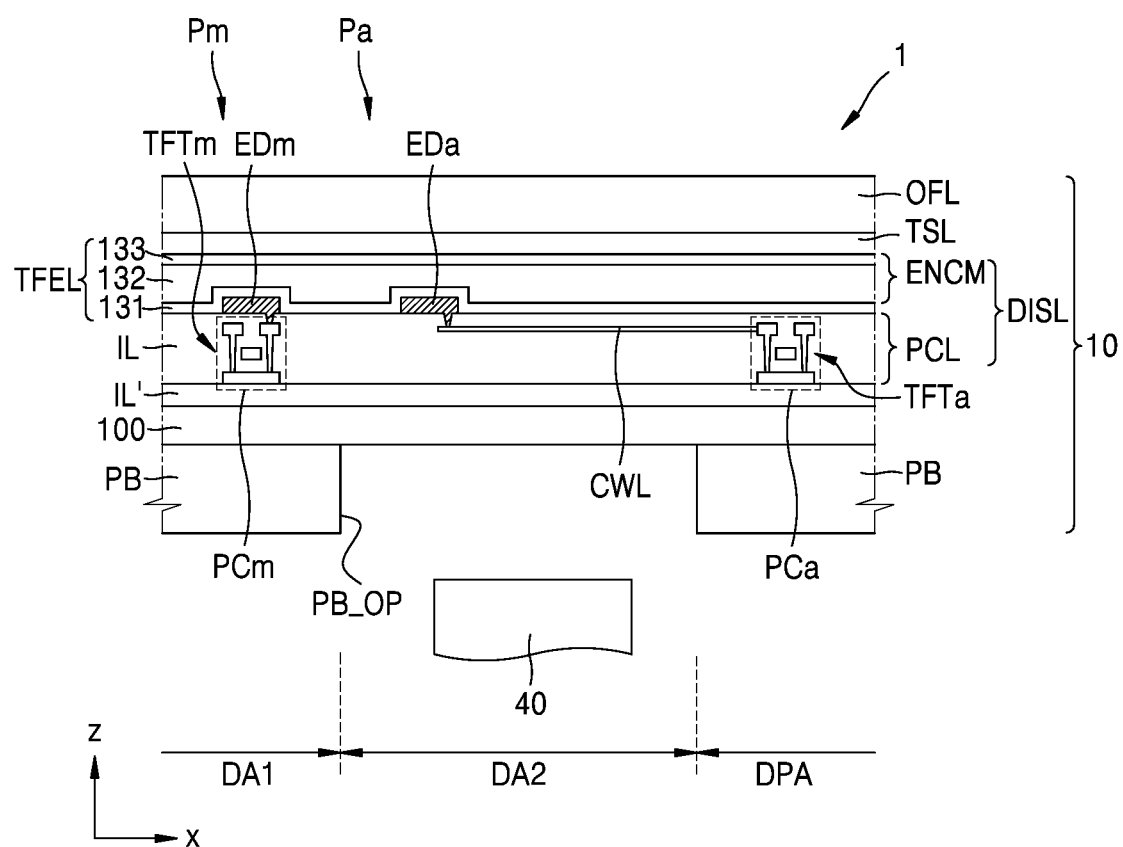
FIG. 2 is a schematic cross-sectional view of a portion of a display apparatus according to an embodiment.

FIG. 2 is a schematic cross-sectional view of a portion of the display apparatus 1 according to an embodiment.

Referring to FIG. 2, the display apparatus 1 may include a display panel 10 and the component 40 overlapping the display panel 10. A cover window (not shown) may be further arranged on the display panel 10, the cover window protecting the display panel 10.

The display panel 10 includes the second display area DA2 and the first display area DA1, the second display area DA2 may overlap the component 40, and the first display area DA1 may display main images. The display panel 10 may include a display layer DISL, a touchscreen layer TSL, an optical functional layer OFL on a substrate 100, and a panel-protecting member PB under the substrate 100.

The display layer DISL may include a circuit layer PCL, a display element layer, and an encapsulation member ENCM, the circuit layer PCL may include thin-film transistors TFTm and TFTa, the display element layer may include light-emitting elements, for example, first and second display elements EDm and EDa, which are display elements, and the encapsulation member ENCM may include a thin-film encapsulation layer TFEL or an encapsulation substrate (not shown). Insulating layers IL and IL' may be arranged between the substrate 100 and the display layer DISL and inside the display layer DISL.

The substrate 100 may include an insulating material such as glass, quartz, a polymer resin, and the like. The substrate 100 may be a rigid substrate or a flexible substrate that is bendable, foldable, or rollable.

A first pixel circuit PCm and a first display element EDm may be arranged in the first display area DA1 of the display panel 10, and the first display element EDm may be electrically connected to the first pixel circuit PCm. The first pixel circuit PCm may include at least one thin-film transistor TFTm and control light emission of the first display element EDm. The first pixel Pm may be implemented by light emission of the first display element EDm.

The second display element EDa may be arranged in the second display area DA2 of the display panel 10 to implement the second pixel Pa. The second display area DA2 is an auxiliary display area, and the resolution of the second display area DA2 may be less than that of the first display area DA1. For example, the number of second display elements EDa per unit area in the second display area DA2 may be less than the number of first display elements EDm per unit area in the first display area DA1.

In the embodiment, a second pixel circuit PCa driving the second display element EDa may not be arranged in the second display area DA2 and may be arranged outside the second display area DA2. In an embodiment, the second pixel circuit PCa may not be arranged in the second display area DA2 and may be arranged in the peripheral area DPA. In an embodiment, the second pixel circuit PCa may be arranged in a third display area between the first display area DA1 and the second display area DA2. However, various modifications may be made. For example, the second pixel circuit PCa may not overlap the second display element EDa.

The second pixel circuit PCa may include at least one thin-film transistor TFTa and be electrically connected to the second display element EDa by a connection wiring CWL.

The second pixel circuit PCa may control light emission of the second display element EDa. The second pixel Pa may be implemented by light emission of the second display element EDa.

The second display area DA2 may include a transmission area through which light or signal emitted from or incident on the component 40 may pass. The transmission area of the second display area DA2 may be a remaining region in which a pixel electrode (an anode) of the second display element EDa is not arranged. The transmission area may be a region other than a region from which the second display element EDa emits light. The transmission area may include a region between the second pixels Pa. The transmission area may include a region between the second display elements EDa.

A buffer layer, a gate insulating layer, and the like that may be included in the insulating layers IL and IL' may be arranged in the transmission area. An organic insulating layer that may be included in the insulating layers IL and IL' may be arranged in the transmission area. An opposite electrode (a cathode) may be arranged in the transmission area. An inorganic encapsulation layer and/or an organic encapsulation layer of the thin-film encapsulation layer TFEL may be arranged in the transmission area. A wiring may be arranged in the transmission area, and the wiring may include metal and/or a transparent conductive material. The substrate 100, a polarizing plate, an adhesive, a window, and the panel-protecting member PB may be arranged in the transmission area.

Only the second display element EDa and the connection wiring CWL may be arranged in the second display area DA2, and the number of second display elements EDa per area in the second display area DA2 may be less than the number of first display elements EDm per area in the first display area DA1. Thus, a light transmittance of the second display area DA2 may be high.

The first display element EDm and the second display element EDa, which are display elements, may be covered by the thin-film encapsulation layer TFEL or the encapsulation substrate. In an embodiment, as shown in FIG. 2, the thin-film encapsulation layer TFEL may include at least one inorganic encapsulation layer and at least one organic encapsulation layer. In an embodiment, the thin-film encapsulation layer TFEL may include first and second inorganic encapsulation layers 131 and 133 and an organic encapsulation layer 132 therebetween.

The first inorganic encapsulation layer 131 and the second inorganic encapsulation layer 133 may each include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and hafnium oxide ($HfO_2$) and be formed by chemical vapor deposition (CVD). The organic encapsulation layer 132 may include a polymer-based material. The polymer-based material may include a silicon-based resin, an acryl-based resin, an epoxy-based resin, polyimide, and polyethylene.

The first inorganic encapsulation layer 131, the organic encapsulation layer 132, and the second inorganic encapsulation layer 133 may each be formed as one body (or integral with each other) to cover (or overlap) the first display area DA1 and the second display area DA2.

In case that the first display element EDm and the second display element EDa, which are display elements, are sealed by the encapsulation substrate (not shown), the encapsulation substrate may be arranged to face the substrate 100 with the display elements therebetween. There may be a gap between the encapsulation substrate and the display element. The encapsulation substrate may include glass. A sealant including frit may be arranged between the substrate 100 and the encapsulation substrate. The sealant may be arranged in the peripheral area DPA. The sealant arranged in the peripheral area DPA may prevent moisture from penetrating through the lateral surfaces of the display area DA while surrounding the display area DA.

The touchscreen layer TSL may be configured to obtain coordinate information corresponding to an external input, for example, a touch event. The touchscreen layer TSL may include a touch electrode and touch wirings electrically connected to the touch electrode. The touchscreen layer TSL may sense an external input by using a self-capacitive method or a mutual capacitive method.

The touchscreen layer TSL may be formed on the thin-film encapsulation layer TFEL. As another example, the touchscreen layer TSL may be separately formed on a touch substrate and then coupled on the thin-film encapsulation layer TFEL by an adhesive layer such as an optically clear adhesive (OCA). In an embodiment, the touchscreen layer TSL may be directly formed on the thin-film encapsulation layer TFEL. In this case, an adhesive layer may not be arranged between the touchscreen layer TSL and the thin-film encapsulation layer TFEL.

The optical functional layer OFL may include an anti-reflection layer. The anti-reflection layer may reduce reflectivity of light (external light) incident on the display apparatus 1 from the outside. In an embodiment, the optical functional layer OFL may be a polarizing film. In an embodiment, the optical functional layer OFL may include a filter plate including a black matrix and color filters.

The panel-protecting member PB may be attached under the substrate 100 and may support and protect the substrate 100. The panel-protecting member PB may include an opening PB_OP corresponding to the second display area DA2. Because the panel-protecting member PB may include the opening PB_OP, a light transmittance of the second display area DA2 may be improved. The panel-protecting member PB may include polyethylene terephthalate (PET) or polyimide (PI).

The area of the second display area DA2 may be greater than an area in which the component 40 is arranged. Accordingly, the area of the opening PB_OP of the panel-protecting member PB may not correspond to the area of the second display area DA2. However, the embodiment is not limited thereto. As an example, the panel-protecting member PB may not include the opening PB_OP and be continuously arranged to correspond to the second display area DA2.

Components 40 may be arranged in the second display area DA2. The components 40 may have different functions. As an example, the components 40 may include at least two of a camera (a photographing element), a solar battery, a flash, a proximity sensor, an illuminance sensor, and an iris sensor.

Figure 3:
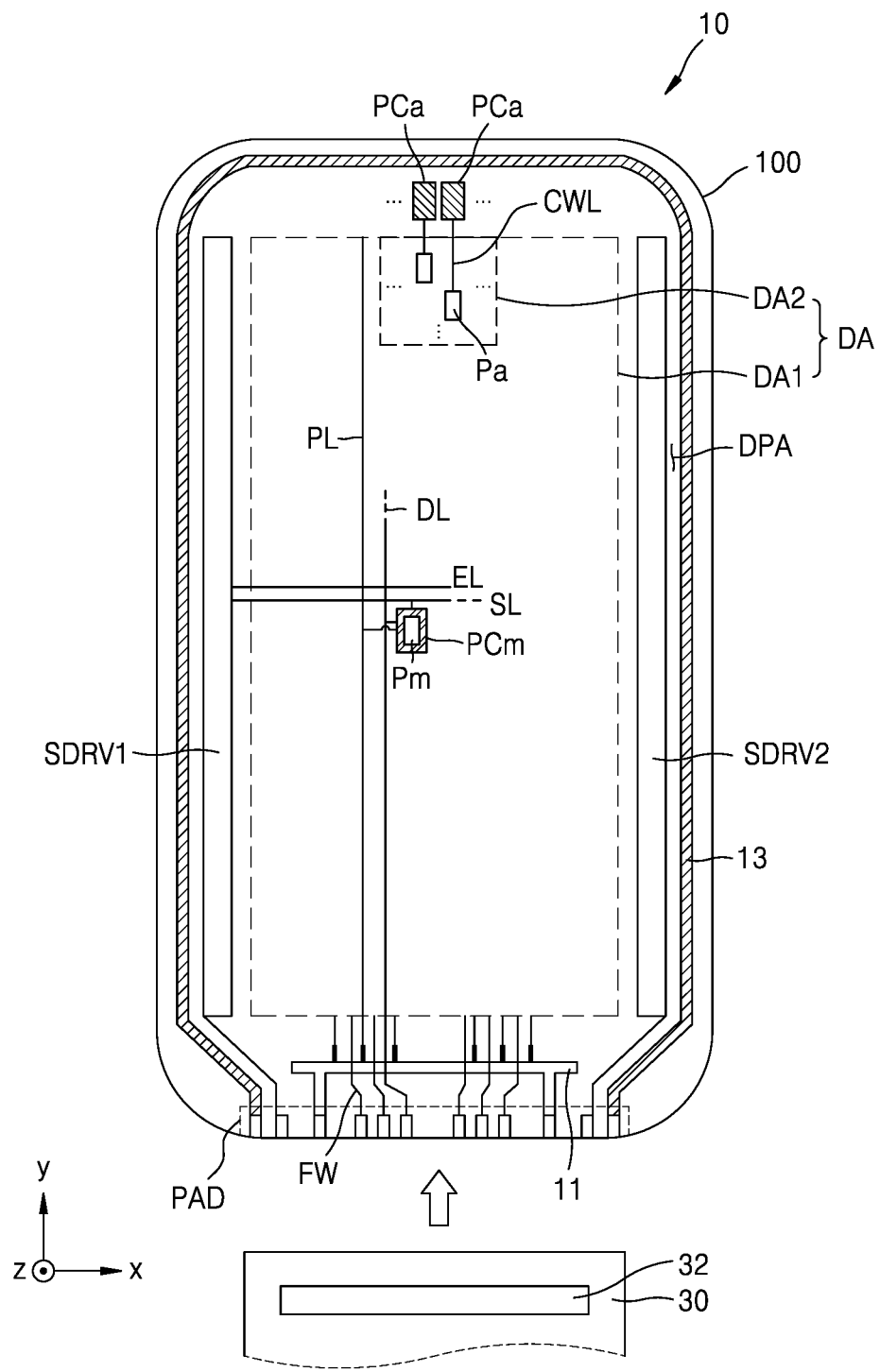
FIG. 3 is a schematic plan view of a display panel that may be included in the display apparatus of FIG. 1 according to an embodiment.

FIG. 3 is a schematic plan view of the display panel 10 that may be included in a display apparatus 1 of FIG. 1 according to an embodiment.

Referring to FIG. 3, various kinds of elements constituting the display panel 10 are arranged over the substrate 100. The substrate 100 includes the display area DA and the peripheral area DPA surrounding the display area DA. The display area DA includes the first display area DA1 and the second display area DA2, main images may be displayed in the first display area DA1, and auxiliary images may be displayed in the second display area DA2. An auxiliary image may form an entire image together with a main image, or may be an image independent of a main image.

The first pixels Pm are arranged in the first display area DA1. The first pixels Pm may each be implemented by a display element such as an organic light-emitting diode OLED. The first pixel circuit PCm may be arranged in the first display area DA1, and the first pixel circuit PCm may drive and overlap the first pixel Pm. Each first pixel Pm may emit, for example, red, green, blue, or white light. The first display area DA1 may be protected from external air or moisture by being covered by an encapsulation member.

The second display area DA2 may be arranged on a side of the first display area DA1 as described above, or may be arranged inside the display area DA and surrounded by the first display area DA1. The second pixels Pa may be arranged in the second display area DA2. The second pixels Pa may each be implemented by a display element such as an organic light-emitting diode OLED. The second pixel circuit PCa driving the second pixel Pa may be arranged in the peripheral area DPA close to the second display area DA2. As an example, in case that the second display area DA2 is arranged on an upper side of the display area DA, the second pixel circuit PCa may be arranged on an upper side of the peripheral area DPA. The second pixel circuit PCa may be electrically connected to a display element implementing the second pixel Pa by the connection wiring CWL extending in a y direction. Each second pixel Pa may emit, for example, red, green, blue, or white light. The second display area DA2 may be protected from external air or moisture and the like by being covered by an encapsulation member.

The resolution of the second display area DA2 may be about ½, ⅜, ⅓, ¼, ⅔, ⅛, ⅑, or ¹⁄₁₆ of the resolution of the first display area DA1. As an example, the resolution of the first display area DA1 may be about 400 ppi or more, and the resolution of the second display area DA2 may be about 200 ppi or about 100 ppi.

Pixel circuits driving the pixels, for example, the first and second pixels Pm and Pa may each be electrically connected to outer circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the first pixel circuits PCm driving the first pixels Pm through a main scan line SL. The first scan driving circuit SDRV1 may apply an emission control signal to each pixel circuit through a main emission control line EL. The second scan driving circuit SDRV2 may be arranged opposite the first scan driving circuit SDRV1 with the first display area DA1 therebetween and be approximately parallel to the first scan driving circuit SDRV1. Some of the pixel circuits of the first pixels Pm in the first display area DA1 may be electrically connected to the first scan driving circuit SDRV1, and the rest thereof may be electrically connected to the second scan driving circuit SDRV2.

The terminal portion PAD may be arranged on a side of the substrate 100. The terminal portion PAD may be exposed and electrically connected to a display circuit board 30 by not being covered by an insulating layer. A display driver 32 may be arranged on the display circuit board 30.

The display driver 32 may generate a control signal transferred to the first scan driving circuit SDRV1 and the second scan driving circuit SDRV2. The display driver 32 generates a data signal. A generated data signal may be transferred to the first pixel circuit PCm through a fan-out wiring FW and a main data line DL electrically connected to the fan-out wiring FW.

The display driver 32 may supply a driving voltage to the driving voltage supply line 11 and supply a common voltage to the common voltage supply line 13. The driving voltage may be applied to the pixel circuit of the pixels, for example, the first and second pixels Pm and Pa through a driving voltage line PL electrically connected to the driving voltage supply line 11, and the common voltage may be supplied to the common voltage supply line 13 and applied to an opposite electrode of the display element.

The driving voltage supply line 11 may extend in an x direction below the first display area DA1. The common voltage supply line 13 may have a loop shape including an open side and surround a portion of the first display area DA1.

Although FIG. 3 shows the case where there is one second display area DA2, but multiple second display areas DA2 may be provided. In this case, the second display areas DA2 may be spaced apart from each other. A first camera may be arranged to correspond to a second display area DA2, and a second camera may be arranged to correspond to another second display area DA2. As another example, a camera may be arranged to correspond to a second display area DA2, and an infrared sensor may be arranged to correspond to another second display area DA2. The shapes and sizes of the second display areas DA2 may be different from each other.

The second display area DA2 may have a circular shape, an elliptical shape, a polygon, or an irregular shape. In an embodiment, the second display area DA2 may have an octagonal shape. The second display area DA2 may have various polygonal shapes such as a quadrangle, a hexagon, and the like. The second display area DA2 may be surrounded by the first display area DA1.

Figure 4:
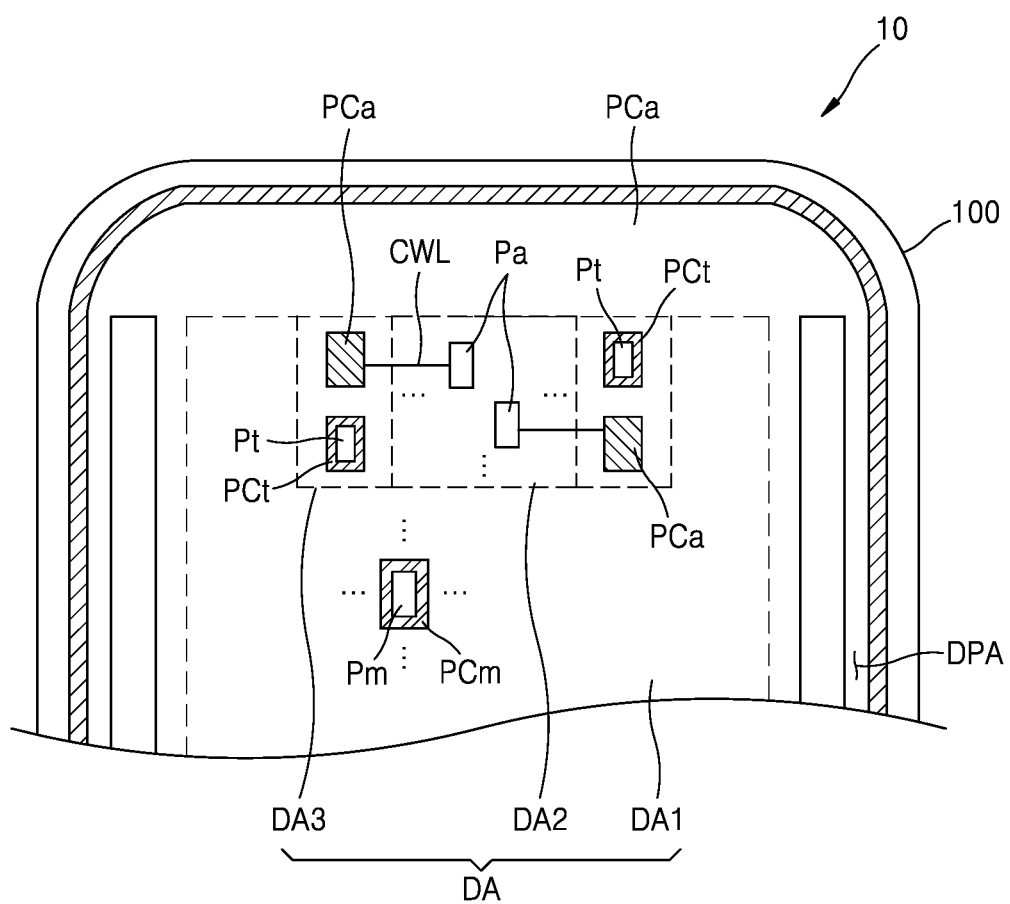
FIG. 4 is a schematic plan view of a display panel that may be included in the display apparatus of FIG. 1 according to an embodiment.
Figure 5:
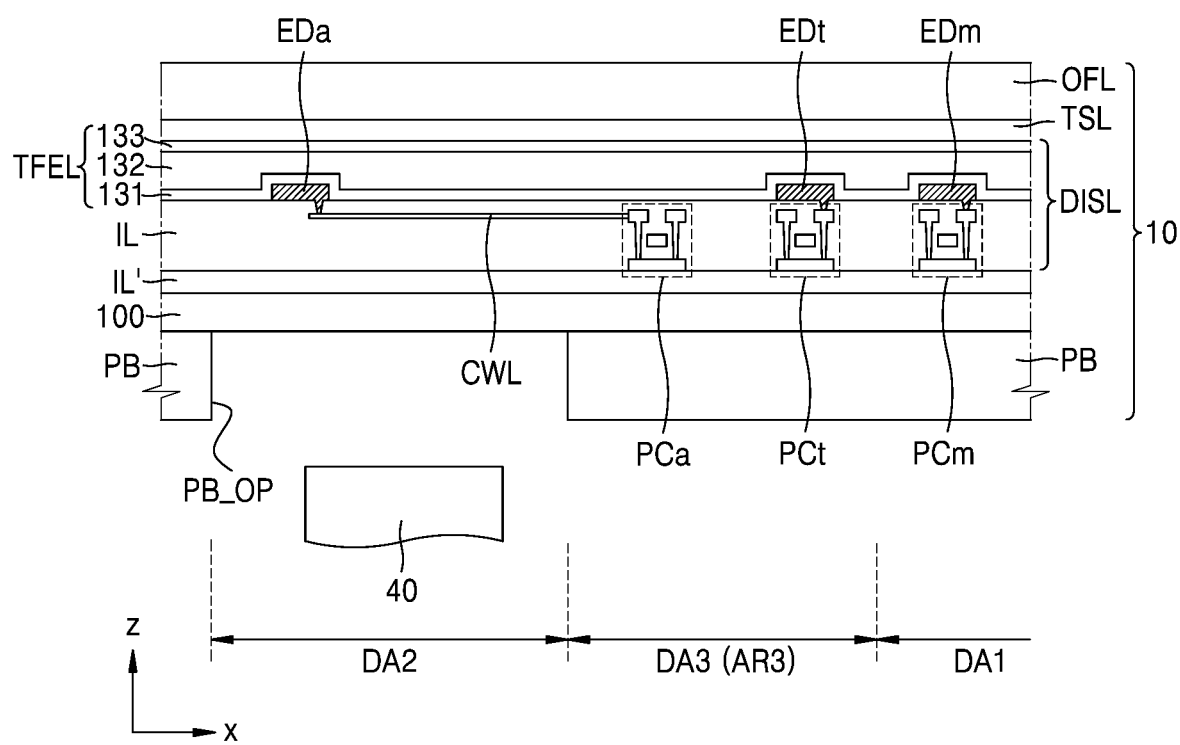
FIG. 5 is a schematic cross-sectional view of the display panel of FIG. 4.

FIG. 4 is a schematic plan view of a display panel that may be included in a display apparatus of FIG. 1 according to an embodiment. FIG. 5 is a schematic cross-sectional view of the display panel of FIG. 4. In FIGS. 4 and 5, same reference numerals as those in FIGS. 2 and 3 denote the same elements, and thus, repeated descriptions thereof are omitted.

Referring to FIGS. 4 and 5, the display area DA of the substrate 100 includes a first display area DA1, a second display area DA2, and a third display area DA3 between the first display area DA1 and the second display area DA2.

The first display area DA1 may be a region in which a main image is displayed. The second display area DA2 and the third display area DA3 may be regions in which an auxiliary image is displayed. An auxiliary image may form (or constitute) an entire image together with a main image, or be an image independent of the main image.

The third display area DA3 may be arranged on at least one side of the second display area DA2. Although it is shown in FIG. 4 that the third display areas DA3 are arranged on left and right sides of the second display area DA2, but the embodiment is not limited thereto. The third display areas DA3 may be arranged on upper and lower sides of the second display area DA2 or may be arranged to surround the second display area DA2. However, various modifications may be made.

Third pixels Pt may be arranged in the third display area DA3. The third pixels Pt may each be implemented by a display element such as an organic light-emitting diode OLED. A third pixel circuit PCt driving the third pixel Pt may be arranged in the third display area DA3 and may overlap the third pixel Pt. Each third pixel Pt may emit, for example, red, green, blue, or white light. The third display area DA3 may be protected from external air or moisture by being covered by an encapsulation member. The third pixel Pt may be implemented by light emission of the third display element EDt.

The second pixel circuit PCa is arranged in the third display area DA3, and the second pixel circuit PCa may drive the second pixel Pa in the second display area DA2. For example, the third display area DA3 may serve as the third area AR3. The second pixel circuit PCa and the third pixel circuit PCt may be alternately arranged in the third display area DA3. The second pixel circuit PCa may be electrically connected to the second display element EDa implementing the second pixel Pa by the connection wiring CWL extending in the x direction.

The resolution of the third display area DA3 may be the same as the resolution of the second display area DA2. As another example, the resolution of the third display area DA3 may be greater than the resolution of the second display area DA2 and less than the resolution of the first display area DA1.

As an example, the resolution of the third display area DA3 may be about ½, ⅜, ⅓, ¼, ⅖, ⅛, ⅑, or ¹⁄₁₆ of the resolution of the first display area DA1. As an example, the resolution of the first display area DA1 may be 400 ppi or more, and the resolutions of the second display area DA2 and the third display area DA3 may be about 200 ppi or about 100 ppi.

In an embodiment, the first pixel circuit PCm, the second pixel circuit PCa, and the third pixel circuit PCt may be the same. However, the embodiment is not limited thereto. The first pixel circuit PCm, the second pixel circuit PCa, and the third pixel circuit PCt may be different from one another. However, various modifications may be made.

Figure 6:
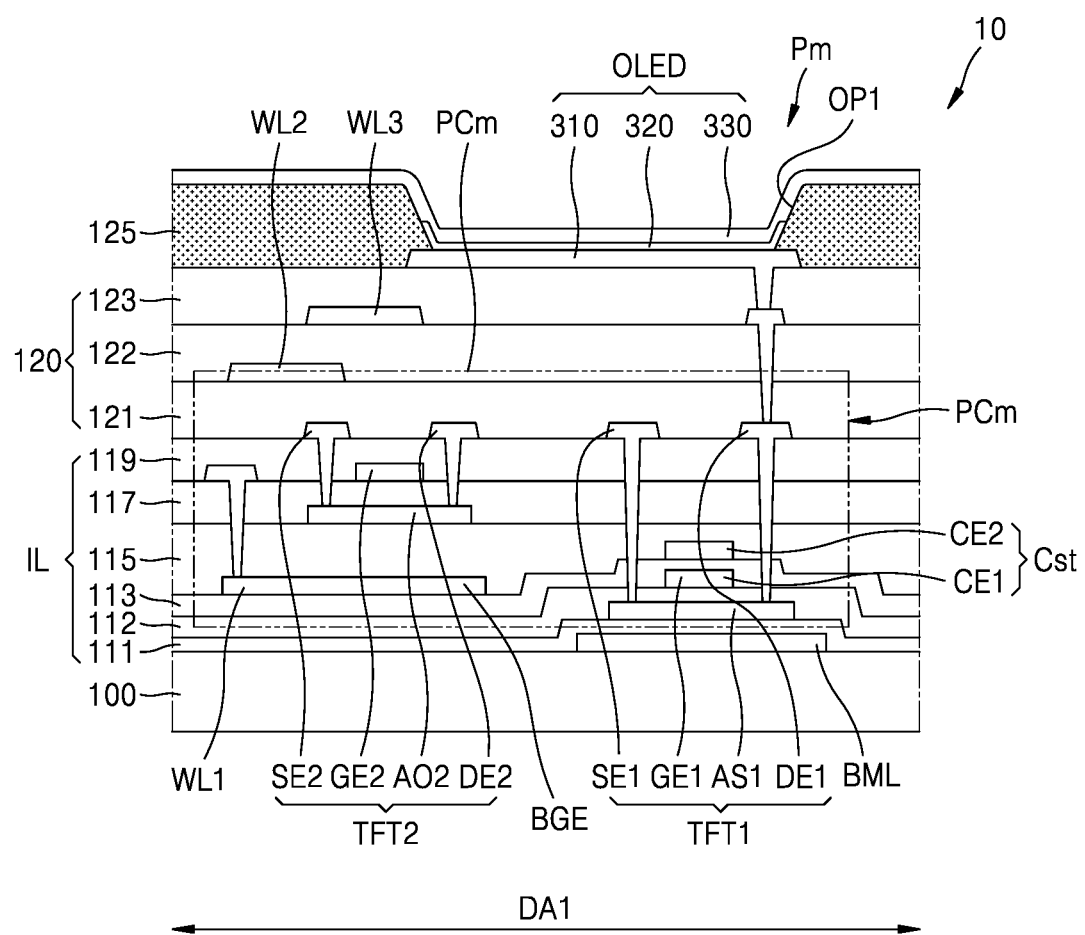
FIG. 6 is a schematic cross-sectional view of a portion of a display panel according to an embodiment.

FIG. 6 is a schematic cross-sectional view of a portion of the first display area DA1 of the display panel 10 according to an embodiment.

Referring to FIG. 6, the first pixel circuit PCm and an organic light-emitting diode OLED may be arranged over the substrate 100 in the first display area DA1 of the display panel 10, and the organic light-emitting diode OLED may be the first display element electrically connected to the first pixel circuit PCm. A lower conductive layer BML may be further arranged between the substrate 100 and the first pixel circuit PCm.

The first pixel circuit PCm according to an embodiment includes a first thin-film transistor TFT1 and a second thin-film transistor TFT2, the first thin-film transistor TFT1 may include a silicon semiconductor, and the second thin-film transistor TFT2 may include an oxide semiconductor. The first pixel circuit PCm may further include a storage capacitor Cst.

The first thin-film transistor TFT1 includes a first semiconductor layer AS1 and a first gate electrode GE1, the first semiconductor layer AS1 may include a silicon semiconductor, and the first gate electrode GE1 may be insulated from the first semiconductor layer AS1. The first thin-film transistor TFT1 may include a first source electrode SE1 and/or a first drain electrode DE1 each electrically connected to the first semiconductor layer AS1. The first thin-film transistor TFT1 may serve as a driving thin-film transistor.

The second thin-film transistor TFT2 includes a second semiconductor layer AO2 and a second gate electrode GE2, the second semiconductor layer AO2 may include an oxide semiconductor, and the second gate electrode GE2 may be insulated from the second semiconductor layer AO2. The second thin-film transistor TFT2 may include a second source electrode SE2 and/or a second drain electrode DE2 each electrically connected to the second semiconductor layer AO2. The second thin-film transistor TFT2 may serve as a switching thin-film transistor. As another example, the second thin-film transistor TFT2 may be any thin-film transistor other than a driving thin-film transistor.

In an embodiment, the first semiconductor layer AS1 of the first thin-film transistor TFT1 serving as the driving thin-film transistor may include polycrystalline silicon having excellent reliability, and the second semiconductor layer AO2 of the second thin-film transistor TFT2 corresponding to the switching thin-film transistor may include an oxide semiconductor having a small leakage current.

In case that the driving thin-film transistor directly influencing the brightness of the display element includes a semiconductor layer including polycrystalline silicon having excellent reliability, a display apparatus of high resolution may be implemented.

A thin-film transistor including an oxide semiconductor may have a high carrier mobility and a low leakage current, and thus a voltage drop is not large even in case that a driving time is long. This means that, in case that a thin-film transistor including an oxide semiconductor is used, a color change of an image is not large depending on a voltage drop even though the display apparatus is driven at low frequencies, and thus, the display apparatus may be driven at low frequencies. Accordingly, in case that a driving circuit includes a thin-film transistor including a semiconductor layer that includes an oxide semiconductor, power consumption thereof may be reduced compared to the case where all thin-film transistors of a driving circuit include a semiconductor layer including polycrystalline silicon.

In the embodiment, because at least one of thin-film transistors except the driving thin-film transistor may include an active layer including an oxide semiconductor, the power consumption of the display apparatus may be reduced.

The lower conductive layer BML may be arranged below the first thin-film transistor TFT1, and the lower conductive layer BML may overlap the first thin-film transistor TFT1. A constant voltage may be applied to the lower conductive layer BML. Because the lower conductive layer BML may be arranged below the first thin-film transistor TFT1, the first thin-film transistor TFT1 may be less influenced by neighboring interference signals, and thus, the reliability of the display apparatus may be improved even more.

Although an organic light-emitting diode is employed as an example of the display element in the embodiment, an inorganic light-emitting element or a quantum-dot light-emitting element may be employed as the display element in another embodiment.

Hereinafter, a structure in which the elements included in the display panel 10 are stacked each other is described.

The substrate 100 may include an insulating material such as glass, quartz, a polymer resin, and the like. The substrate 100 may be a rigid substrate or a flexible substrate that is bendable, foldable, or rollable. The substrate 100 may have a single-layered structure or a multi-layered structure formed of the above materials. In case of the multi-layered structure, the substrate 100 may further include an inorganic layer. In an embodiment, the substrate 100 may have a structure of organic material/inorganic material/organic material.

A buffer layer 111 may be arranged on the substrate 100, may reduce or prevent the penetration of foreign materials, moisture, or external air from below the substrate 100, and may provide a flat surface on the substrate 100. The buffer layer 111 may include an inorganic material such as oxide or nitride, an organic material, or an organic/inorganic composite material and have a single-layered structure or a multi-layered structure formed of an inorganic material and an organic material. In an embodiment, the buffer layer 111 may include silicon oxide ($SiO_2$) or silicon nitride ($SiN_x$).

The lower conductive layer BML may be arranged between the substrate 100 and the buffer layer 111. The lower conductive layer BML may include a conductive material. In some embodiments, the lower conductive layer BML may include a transparent conductive material. As an example, the lower conductive layer BML may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The lower conductive layer BML may overlap the first thin-film transistor TFT1. A constant voltage may be applied to the lower conductive layer BML. A barrier layer (not shown) may be further arranged between the substrate 100 and the lower conductive layer BML, and the barrier layer may block the penetration of external air. The barrier layer may include an inorganic material such as oxide or nitride, an organic material, or an organic and inorganic composite material and have a single-layered structure or a multi-layered structure formed of an inorganic material and an organic material.

The first semiconductor layer AS1 including a silicon semiconductor may be arranged on the buffer layer 111, and the first semiconductor layer AS1 may include polycrystalline silicon or amorphous silicon. The first semiconductor layer AS1 may include a channel region, a source region, and a drain region, and the source region and the drain region may be doped with impurities.

A first gate insulating layer 112 may cover (or overlap) the first semiconductor layer AS1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), and titanium oxide ($TiO_2$). The first gate insulating layer 112 may include a single layer or a multi-layer including the above inorganic insulating materials.

A first gate electrode GE1 is arranged on the first gate insulating layer 112 to overlap the first semiconductor layer AS1. The first gate electrode GE1 may include at least one of molybdenum (Mo), aluminum (Al), copper (Cu), and titanium (Ti) and include a single layer or a multi-layer. As an example, the first gate electrode GE1 may be a single Mo layer.

A second gate insulating layer 113 may cover the first gate electrode GE1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), and titanium oxide ($TiO_2$). The second gate insulating layer 113 may include a single layer or a multi-layer including the above inorganic insulating materials.

The storage capacitor Cst may overlap the first gate electrode GE1. The storage capacitor Cst includes a lower electrode CE1 and an upper electrode CE2. A second gate insulating layer 113 is arranged between the lower electrode CE1 and the upper electrode CE2. In this case, the first gate electrode GE1 may serve as the lower electrode CE1 of the storage capacitor Cst as well as the first gate electrode GE1 of the first thin-film transistor TFT1. For example, the first gate electrode GE1 and the lower electrode CE1 may be integral with each other. The upper electrode CE2 is arranged on the second gate insulating layer 113 to overlap the lower electrode CE1.

A first wiring WL1 and a bottom gate electrode BGE are arranged on the second gate insulating layer 113. The first wiring WL1 may be configured to transfer a signal to the first thin-film transistor TFT1 or the second thin-film transistor TFT2. The bottom gate electrode BGE may overlap the second semiconductor layer AO2 of the second thin-film transistor TFT2 to apply a gate signal to the second thin-film transistor TFT2. In this case, the second thin-film transistor TFT2 may have a double gate electrode structure in which gate electrodes are arranged over and below the second semiconductor layer AO2.

The bottom gate electrode BGE may be provided as a portion of the first wiring WL1. In this case, the first wiring WL1 may be configured to transfer a signal to the second thin-film transistor TFT2.

The second gate insulating layer 113 may include an inorganic material including oxide or nitride. As an example, the second gate insulating layer 113 may include at least one of silicon oxide ($SiO_2$), silicon nitride ($SiN_x$), silicon oxynitride ($SiO_xN_y$), aluminum oxide ($Al_2O_3$), and titanium oxide ($TiO_2$).

A first interlayer insulating layer 115 may cover the upper electrode CE2, the first wiring WL1, and the bottom gate electrode BGE. The first interlayer insulating layer 115 may include at least one of silicon oxide ($SiO_2$), silicon nitride ($SiN_x$), silicon oxynitride ($SiO_xN_y$), aluminum oxide ($Al_2O_3$), and titanium oxide ($TiO_2$). The first interlayer insulating layer 115 may include a single layer or a multi-layer including the above inorganic insulating materials.

The second semiconductor layer AO2 including an oxide semiconductor may be arranged on the first interlayer insulating layer 115. The second semiconductor layer AO2 may include a channel region, a source region, and a drain region, and the source region and the drain region may be disposed on two opposite sides of the channel region. The second semiconductor layer AO2 may include an oxide formed of at least one of indium (In), gallium (Ga), stannum (Sn), zirconium (Zr), vanadium (V), hafnium (Hf), titanium (Ti), and zinc (Zn). In an embodiment, the second semiconductor layer AO2 may include an indium gallium zinc oxide (IGZO) semiconductor containing metal such as indium (In) and gallium (Ga) in ZnO.

The source region and the drain region of the second semiconductor layer AO2 may be formed by adjusting a carrier concentration of an oxide semiconductor and making the source region and the drain region conductive. For example, the source region and the drain region of the second semiconductor layer AO2 may be formed by increasing the carrier concentration through plasma treatment that uses a hydrogen (H)-based gas, a fluorine (F)-based gas, or a combination thereof, on the oxide semiconductor.

A second gate electrode GE2 is arranged on the second semiconductor layer AO2. A second interlayer insulating layer 117 is arranged between the second semiconductor layer AO2 and the second gate electrode GE2. The second gate electrode GE2 overlaps the second semiconductor layer AO2 and is insulated from the second semiconductor layer AO2 by the second interlayer insulating layer 117.

The second interlayer insulating layer 117 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second interlayer insulating layer 117 may include a single layer or a multi-layer including the above inorganic insulating materials.

A third interlayer insulating layer 119 may be arranged on the second gate electrode GE2. The first source electrode SE1 and/or the first drain electrode DE1, and the second source electrode SE2 and/or the second drain electrode DE2 may be arranged on the third interlayer insulating layer 119, the first source electrode SE1 and/or the first drain electrode DE1 may be electrically connected to the first semiconductor layer AS1, and the second source electrode SE2 and/or the second drain electrode DE2 may be electrically connected to the second semiconductor layer AS2. A data line and a driving voltage line may be arranged on the third interlayer insulating layer 119, the data line may be configured to transfer a data signal, and the driving voltage line may be configured to transfer a driving voltage. The first source electrode SE1, the first drain electrode DE1, the second source electrode SE2, or the second drain electrode DE2 may be electrically connected to the data line or the driving voltage line directly or through another thin-film transistor.

The third interlayer insulating layer 119 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The third interlayer insulating layer 119 may include a single layer or a multi-layer including the above inorganic insulating materials.

The first source electrode SE1 and/or the first drain electrode DE1, and the second source electrode SE2 and/or the second drain electrode DE2 may include a material having high conductivity such as metal, conductive oxide and the like. As an example, the first source electrode SE1 and/or the first drain electrode DE1, and the second source electrode SE2 and/or the second drain electrode DE2 may include a single layer or a multi-layer including aluminum (Al), copper (Cu), titanium (Ti), and the like. In an embodiment, the first source electrode SE1 and/or the first drain electrode DE1, and the second source electrode SE2 and/or the second drain electrode DE2 may include a triple layer of Ti/Al/Ti that are sequentially stacked.

An organic insulating layer 120 is arranged on the first source electrode SE1 and/or the first drain electrode DE1, and the second source electrode SE2 and/or the second drain electrode DE2. The organic insulating layer 120 may include a single layer or a multi-layer. As an example, the organic insulating layer 120 may include a first organic insulating layer 121, a second organic insulating layer 122, and a third organic insulating layer 123. In this case, a second wiring WL2 may be arranged on the first organic insulating layer 121. A third wiring WL3 may be arranged on the second organic insulating layer 122. The second wiring WL2 and the third wiring WL3 may be configured to transfer various signals and/or voltages to the first pixel circuit PCm.

The organic insulating layer 120 may include a general-purpose polymer such as photosensitive polyimide, polyimide, polycarbonate (PC), benzocyclobutene (BCB), polyimide, hexamethyldisiloxane (HMDSO), polymethylmethacrylate (PMMA), or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer.

As another example, the organic insulating layer 120 may include a siloxane-based organic material. The siloxane-based organic material may include hexamethyldisiloxane, octamethyltrisiloxane, decamethyltetrasiloxane, dodecamethylpentasiloxane, and polydimethylsiloxanes. The organic insulating layer 120 may serve as a protection layer covering thin-film transistors. All of the first organic insulating layer 121, the second organic insulating layer 122, and the third organic insulating layer 123 may include a same material, or at least one of the first organic insulating layer 121, the second organic insulating layer 122, and the third organic insulating layer 123 may include a different material. However, various modifications may be made.

An organic light-emitting diode OLED may be arranged on the organic insulating layer 120, and the organic light-emitting diode OLED may include a pixel electrode 310, an opposite electrode 330, and an emission layer 320 therebetween.

The pixel electrode 310 may be electrically connected to the first drain electrode DE1 through a contact hole defined in the organic insulating layer 120 and electrically connected to a first drain region of the first thin-film transistor TFT1 by the first drain electrode DE1. The pixel electrode 310 may be directly connected to the first thin-film transistor TFT1 or indirectly connected to the first thin-film transistor TFT1 through another thin-film transistor (not shown) controlling light emission.

The pixel electrode 310 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 310 may include a reflective layer including silver (Ag), magnesium (Mg), aluminum (Al), or a compound thereof. As an example, the pixel electrode 310 may include a structure including at least one layer on/under the reflective layer, and the at least one layer may include ITO, IZO, ZnO, or $In_2O_3$. In this case, the pixel electrode 310 may have a structure of ITO/Ag/ITO that are stacked.

A pixel-defining layer 125 may be arranged on the organic insulating layer 120. The pixel-defining layer 125 may define a pixel by covering the edges of the pixel electrode 310 and including an opening that exposes a central portion of the pixel electrode 310. For example, an emission area of the organic light-emitting diode OLED, for example, the size and shape of the first pixel Pm, may be defined by the opening of the pixel-defining layer 125.

The pixel-defining layer 125 prevents an arc and the like from occurring at the edges of the pixel electrode 310 by increasing a distance between the edges of the pixel electrode 310 and the opposite electrode 330 over the pixel electrode 310. The pixel-defining layer 125 may include an organic insulating material such as polyimide, polyamide, an acrylic resin, benzocyclobutene, HMDSO, a phenolic resin, and the like and be formed by spin coating and the like.

In an embodiment, the pixel-defining layer 125 may include an insulating material (e.g., an organic insulating material) including pigment or dye having black color. The pixel-defining layer 125 including a light-blocking layer may improve visibility by preventing color mixing between neighboring pixels.

The emission layer 320 of the organic light-emitting diode OLED may include a low-molecular weight material or a polymer material and emit red, green, blue, or white light.

A first common layer (not shown) and/or a second common layer (not shown) may be arranged under and on the emission layer 320. The first common layer is an element under the emission layer 320 and may include, for example, a hole transport layer (HTL) or an HTL and a hole injection layer (HIL). The second common layer is an element on the emission layer 320 and may include an electron transport layer (ETL) and/or an electron injection layer (EIL). In an embodiment, the second common layer may be omitted.

Unlike the emission layer 320 arranged for each pixel to respectively correspond to openings OP1 and OP2 (OP2 not shown) of the pixel-defining layer 125, the first common layer and the second common layer, similar to the opposite electrode 330 described below, may be common layers formed as one body to cover (or overlap) the display area DA of the substrate 100 entirely.

The opposite electrode 330 is arranged on the emission layer 320. The opposite electrode 330 may include a conductive material having a low work function. As an example, the opposite electrode 330 may include a (semi) transparent layer including silver (Ag), magnesium (Mg), aluminum (Al), platinum (Pt), lithium (Li), calcium (Ca), or an alloy thereof. As another example, the opposite electrode 330 may further include a layer on the (semi) transparent layer including the above materials, and the layer may include ITO, IZO, ZnO, or $In_2O_3$. The opposite electrode 330 may be formed as a body over organic light-emitting diodes to correspond to pixel electrodes 310.

The organic light-emitting diode OLED implementing the first pixel Pm in the first display area DA1 overlaps the first pixel circuit PCm. For example, the pixel electrode 310 of the organic light-emitting diode OLED may overlap at least one thin-film transistor included in the first pixel circuit PCm.

Figure 7:
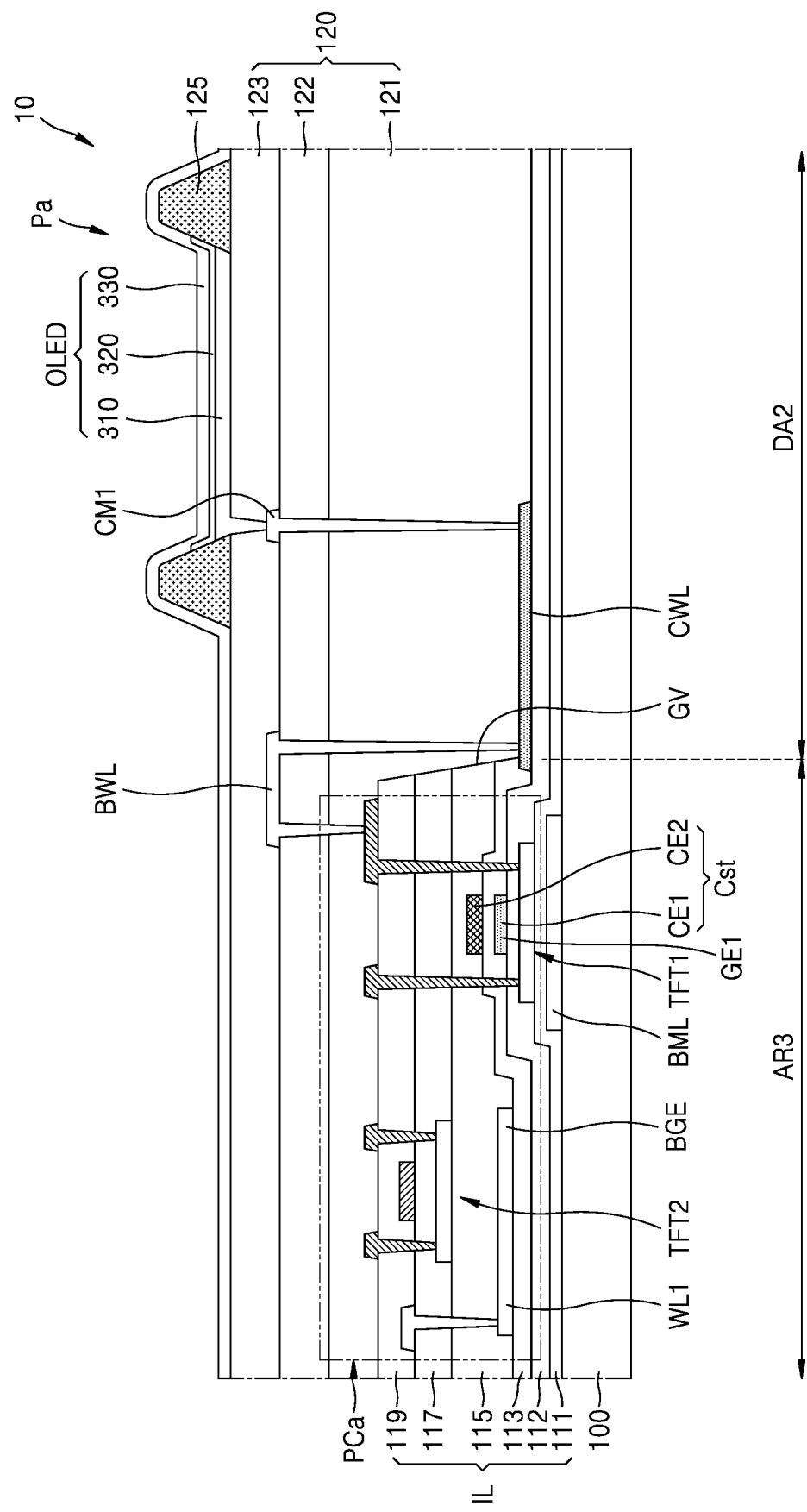
FIG. 7 is a schematic cross-sectional view of a portion of a display panel according to an embodiment.

FIG. 7 is a schematic cross-sectional view of a portion of the second display area DA2 and the third display area AR3 of the display panel 10 according to an embodiment. The third display area AR3 may be the third display area DA3 or the peripheral area DPA. In FIG. 7, the same reference numerals as those in FIG. 6 denote the same elements, and thus, repeated descriptions thereof are omitted.

Referring to FIG. 7, an organic light-emitting diode OLED may be arranged in the second display area DA2 of the display panel 10, and the organic light-emitting diode OLED may be a second display element implementing the second pixel Pa. The second pixel circuit PCa may be arranged in the third area AR3 of the display panel 10, and the second pixel circuit PCa may be electrically connected to the second display element.

The second pixel circuit PCa may include the first thin-film transistor TFT1, the second thin-film transistor TFT2, and the storage capacitor Cst, the first thin-film transistor TFT1 may include a silicon semiconductor, and the second thin-film transistor TFT2 may include an oxide semiconductor. The lower conductive metal BML may be further arranged between the substrate 100 and the second pixel circuit PCa. The lower conductive metal BML may overlap the first thin-film transistor TFT1. Elements of the second pixel circuit PCa may be similar to those of the first pixel circuit PCm, and thus the description of the first pixel circuit PCm replaces the description of the second pixel circuit PCa.

The second pixel circuit PCa arranged outside the second display area DA2, for example, in the third area AR3, may be electrically connected to the organic light-emitting diode OLED, which is the second display element, arranged in the second display area DA2 by the connection wiring CWL.

The connection wiring CWL and at least one of the conductive layers of the second pixel circuit PCa may include a same material and be simultaneously formed.

Referring to FIG. 7, the connection wiring CWL and the first gate electrode GE1 of the first thin-film transistor TFT1 may include a same material and be arranged in a same layer. The connection wiring CWL may include metal such as molybdenum (Mo), aluminum (Al), copper (Cu), titanium (Ti), and the like and include a single layer or a multi-layer. The connection wiring CWL may be arranged on the first gate insulating layer 112. The connection wiring CWL and the first gate electrode GE1 may be simultaneously formed by a same process.

In case that the connection wiring CWL includes a separate material other than the conductive layer of the second pixel circuit PCa, for example, a transparent conductive oxide, a separate process of forming the connection wiring needs to be added, and thus, processing time and processing costs may increase. In case that the connection wiring CWL includes a transparent conductive oxide, a specific resistance thereof is higher than that of metal, and thus, the brightness of the organic light-emitting diodes OLED arranged in the second display area DA2 may be reduced.

In an embodiment, the connection wiring CWL and the first gate electrode GE1 may be formed by the same process, and thus processing time and processing costs may be reduced. The connection wiring CWL and the first gate electrode GE1 include a same metal, and thus uniform brightness of the organic light-emitting diodes OLED may be secured. Because the connection wiring CWL may be arranged by using an opaque metal, a light transmittance of the second display area DA2 may not be uniform depending on a location thereof. In an embodiment, the width of the connection wiring CWL is adjusted depending on a location thereof, a light transmittance of the second display area DA2 may be uniform depending on a location thereof. This is described below.

In an embodiment, an inorganic insulating layer IL of the display panel 10 includes a groove GV corresponding to the second display area DA2. At least a portion of the connection wiring CWL may be arranged inside the groove GV.

As an example, assuming that the buffer layer 111, the first gate insulating layer 112, the second gate insulating layer 113, the first interlayer insulating layer 115, the second interlayer insulating layer 117, and the third interlayer insulating layer 119 are collectively referred to as the inorganic insulating layer IL, the inorganic insulating layer IL may include the groove GV corresponding to the second display area DA2.

The groove GV may be provided by removing a portion of the inorganic insulating layer IL. As an example, the buffer layer 111 and the first gate insulating layer 112 may be continuously arranged over the second display area DA2. The second gate insulating layer 113, the first interlayer insulating layer 115, the second interlayer insulating layer 117, and the third interlayer insulating layer 119 may respectively include openings corresponding to the second display area DA2. These openings may be respectively formed by separate processes or simultaneously formed by a same process. In case that these openings are formed by separate processes, the inner surface of the groove GV may not be smooth and may have a step difference such as a stair shape.

The connection wiring CWL and the first gate electrode GE1 of the first thin-film transistor TFT1 may be formed by a same process, and thus the groove GV may be formed after the connection wiring CWL is formed. In this case, an end of the connection wiring CWL may not be exposed by the groove GV.

The first organic insulating layer 121 may cover the connection wiring CWL arranged inside the groove GV and fill the groove GV. The connection wiring CWL may be arranged between the first gate insulating layer 112 and the first organic insulating layer 121 in the second display area DA2. The first gate insulating layer 112 may have a higher light transmittance than the inorganic insulating layer IL. Accordingly, a light transmittance of the second display area DA2 may be improved even more. Due to the nature of an organic material, the first organic insulating layer 121 may protect the connection wiring CWL such that cracks and the like are not formed in the connection wiring CWL by absorbing impacts that may be applied to the connection wiring CWL.

One end (or first end) of the connection wiring CWL may be electrically connected to the second pixel circuit PCa by a bridge wiring BWL. In an embodiment, the bridge wiring BWL is arranged on the second organic insulating layer 122 and be electrically connected to the thin-film transistor of the second pixel circuit PCa and the connection wiring CWL through contact holes. In an embodiment, the bridge wiring BWL may be arranged on the first organic insulating layer 121 or arranged on the third interlayer insulating layer 119. However, various modifications may be made. Another end (or second end) of the connection wiring CWL may be electrically connected to the pixel electrode 310 of the organic light-emitting diode OLED through a first contact electrode CM1. The first contact electrode CM1 may be electrically connected to another end of the connection wiring CWL through a contact hole passing through the second organic insulating layer 122 and the first organic insulating layer 121. The pixel electrode 310 may be electrically connected to the first contact electrode CM1 through a contact hole passing through the third organic insulating layer 123.

A pixel-defining layer 125 in the second display area DA2 may be spaced apart from the pixel-defining layer 125 in the first display area DA1. The pixel-defining layer 125 may include a light-blocking material. As an example, the pixel-defining layer 125 may include an insulating material (e.g., an organic insulating material) including pigment or dye having black color. The pixel-defining layer 125 including a light-blocking layer may prevent color mixing between neighboring pixels and improve visibility by absorbing light reflected to the display panel 10 by the component 40 (see FIG. 2). The pixel-defining layer 125 may include a light-blocking material, and thus the pixel-defining layer 125 in the second display area DA2 may be patterned for each second pixel Pa. The pixel-defining layer 125 may cover (or overlap) the edges of the pixel electrode 310 and includes an opening that exposes a central portion of the pixel electrode 310, a planar shape of the pixel-defining layer 125 may have a ring shape or a doughnut shape. In an embodiment, the opening of the pixel-defining layer 125 may be circular in a plan view. As another example, the opening of the pixel-defining layer 125 may have an elliptical shape or a polygonal shape with rounded corners.

FIGS. 8 to 11 are schematic cross-sectional views of a portion of the display panel 10 according to an embodiment. In FIGS. 8 to 11, the same reference numerals as those of FIGS. 6 and 7 denote the same elements, and thus, repeated descriptions thereof are omitted.

Figure 8:
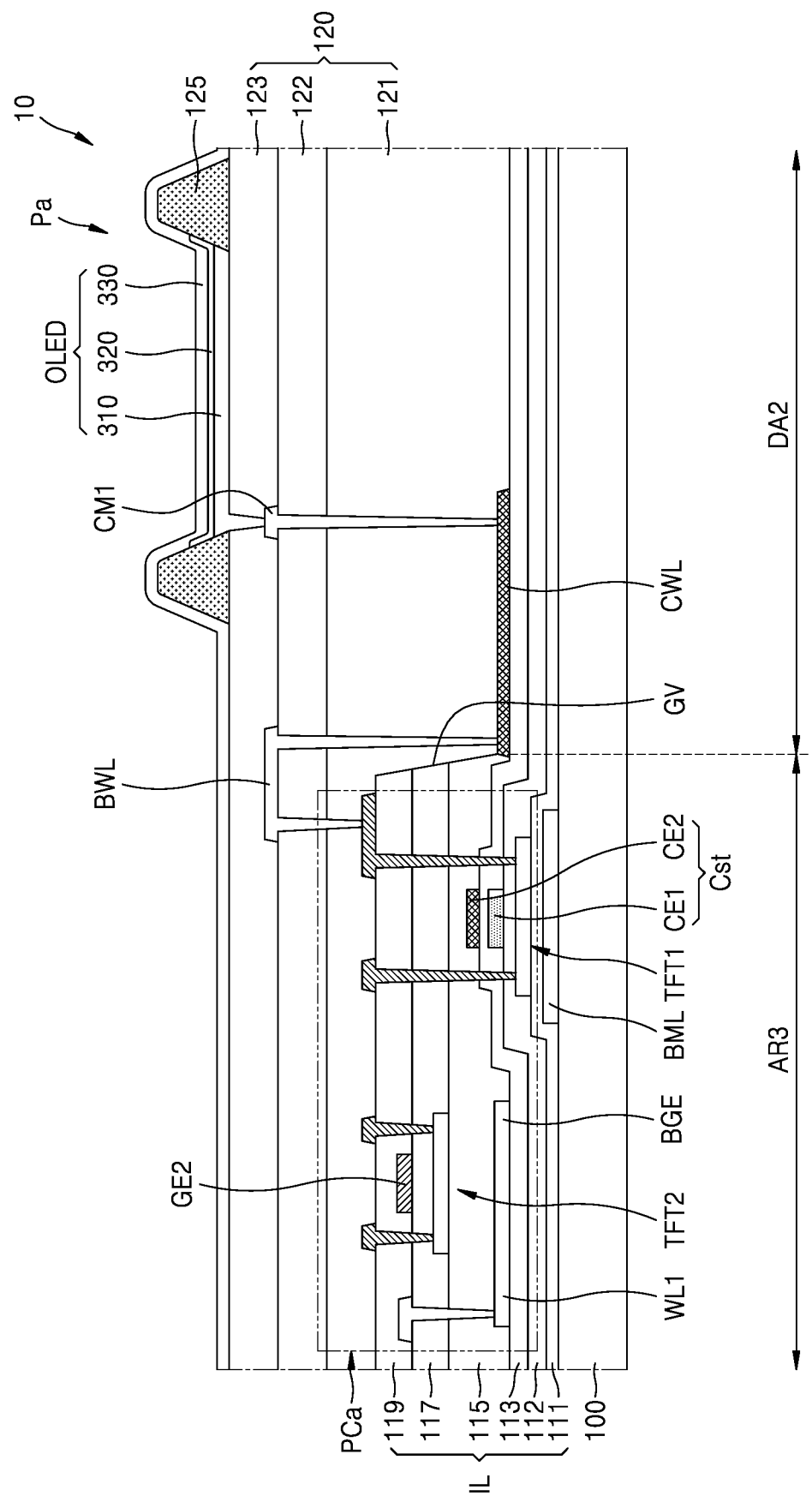
FIG. 8 is a schematic cross-sectional view of a portion of a display panel according to an embodiment.

Referring to FIG. 8, the connection wiring CWL and the upper electrode CE2 of the storage capacitor Cst may include a same material and be arranged on a same layer. The connection wiring CWL may include metal such as molybdenum (Mo), aluminum (Al), copper (Cu), titanium (Ti), and the like and include a single layer or a multi-layer. The connection wiring CWL may be arranged on the second gate insulating layer 113. The connection wiring CWL and the upper electrode CE2 may be formed by a same process.

The groove GV may be formed by removing a portion of the inorganic insulating layer IL. As an example, the buffer layer 111, the first gate insulating layer 112, and the second gate insulating layer 113 may be continuously arranged over the second display area DA2. The first interlayer insulating layer 115, the second interlayer insulating layer 117, and the third interlayer insulating layer 119 may respectively include openings corresponding to the second display area DA2. These openings may be respectively formed by separate processes or simultaneously formed by a same process. In case that these openings are formed by separate processes, the inner surface of the groove GV may not be smooth and may have a step difference such as a stair shape. The groove GV may be formed after the connection wiring CWL is formed.

The first gate insulating layer 112 may cover the connection wiring CWL arranged inside the groove GV and fill the groove GV. The connection wiring CWL may be arranged between the second gate insulating layer 113 and the first organic insulating layer 121 in the second display area DA2.

Figure 9:
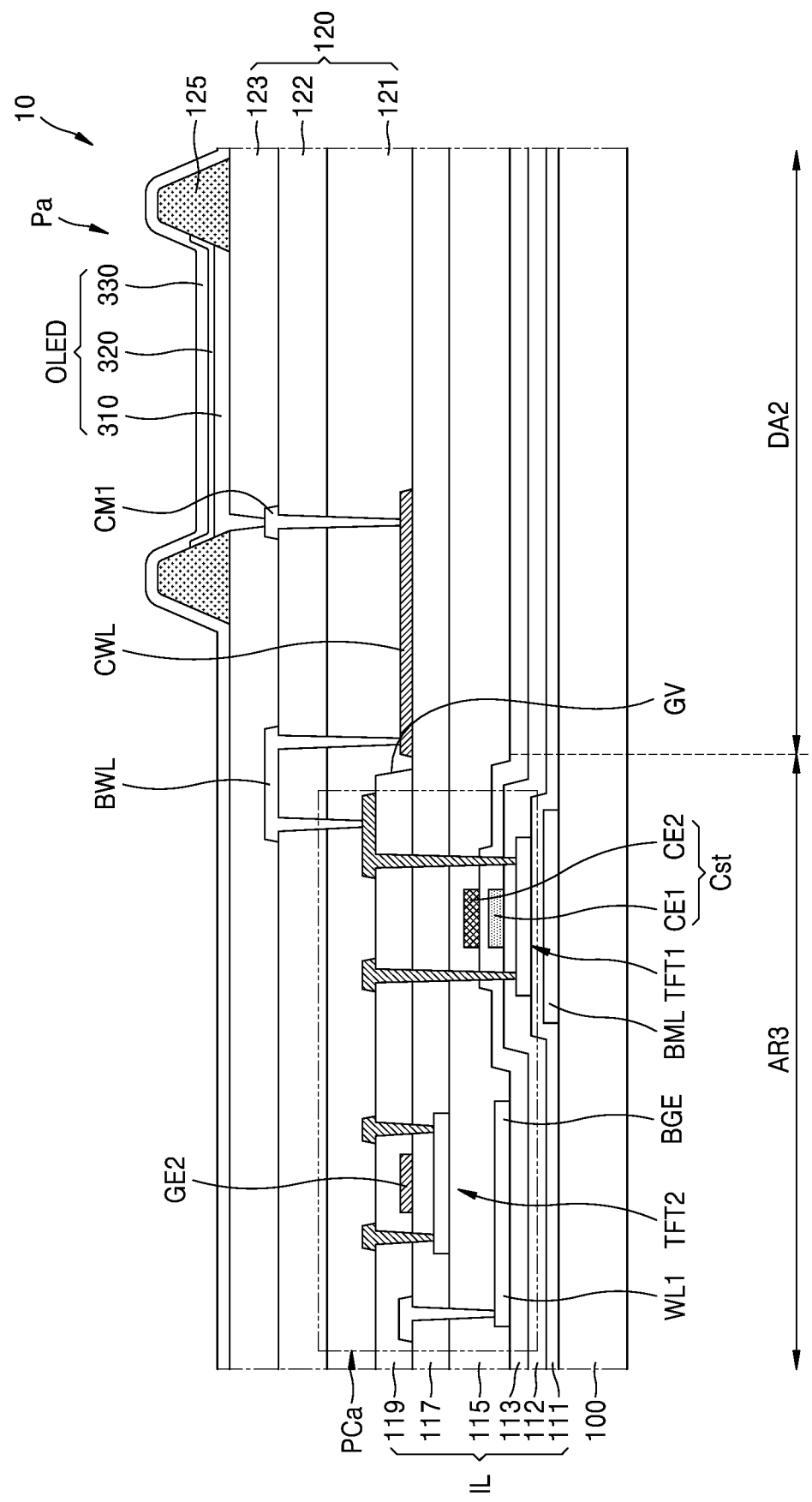
FIG. 9 is a schematic cross-sectional view of a portion of a display panel according to an embodiment.

Referring to FIG. 9, the connection wiring CWL and the second gate electrode GE2 of the second thin-film transistor TFT2 may include a same material and be arranged on a same layer. The connection wiring CWL may include metal such as molybdenum (Mo), aluminum (Al), copper (Cu), titanium (Ti), and the like and include a single layer or a multi-layer. The connection wiring CWL may be arranged on the second interlayer insulating layer 117. The connection wiring CWL and the second gate electrode GE2 may be formed by a same process.

The groove GV may be formed by removing a portion of the inorganic insulating layer IL. As an example, the buffer layer 111, the first gate insulating layer 112, the second gate insulating layer 113, the first interlayer insulating layer 115, and the second interlayer insulating layer 117 may be continuously arranged over the second display area DA2. The third interlayer insulating layer 119 may include openings corresponding to the second display area DA2. The groove GV may be formed after the connection wiring CWL is formed.

The first organic insulating layer 121 may cover (or overlap) the connection wiring CWL arranged inside the groove GV and fill the groove GV. The connection wiring CWL may be arranged between the second interlayer insulating layer 117 and the first organic insulating layer 121 in the second display area DA2.

Figure 10:
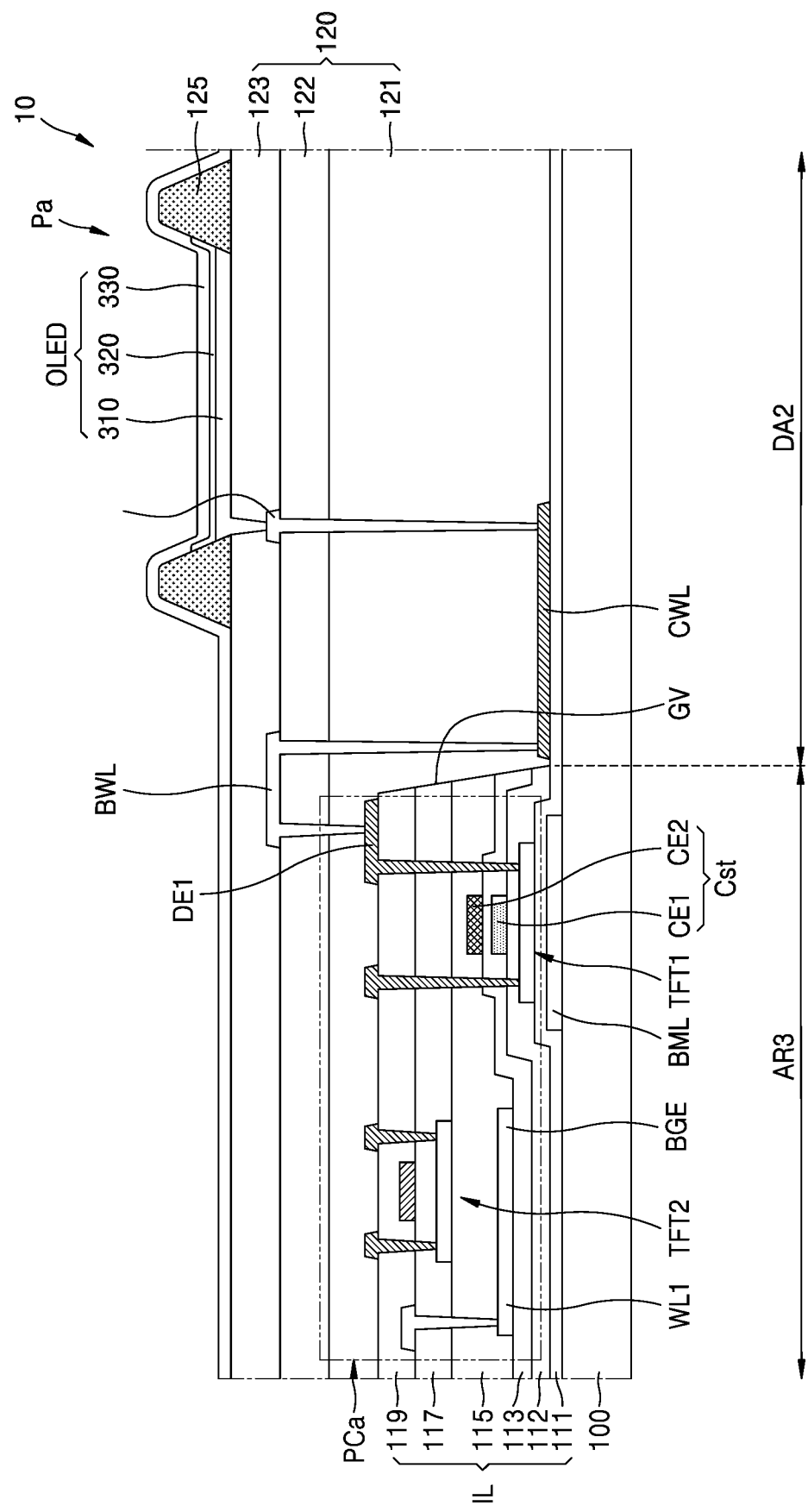
FIG. 10 is a schematic cross-sectional view of a portion of a display panel according to an embodiment.

Referring to FIG. 10, the connection wiring CWL and the first source electrode SE1 and/or the first drain electrode DE1 of the first thin-film transistor TFT1 may include a same material. The first source electrode SE1 and/or the first drain electrode DE1 may be arranged on the inorganic insulating layer IL. The connection wiring CWL may include metal such as molybdenum (Mo), aluminum (Al), copper (Cu), titanium (Ti), and the like and include a single layer or a multi-layer. The connection wiring CWL and the first source electrode SE1 and/or the first drain electrode DE1 may be simultaneously formed by a same process.

The groove GV may be formed by removing a portion of the inorganic insulating layer IL. As an example, the buffer layer 111 may be continuously arranged over the second display area DA2. The first gate insulating layer 112, the second gate insulating layer 113, the first interlayer insulating layer 115, the second interlayer insulating layer 117, and the third interlayer insulating layer 119 may respectively include openings corresponding to the second display area DA2. These openings may be respectively formed by separate processes or simultaneously formed by a same process. In case that these openings are formed by separate processes, the inner surface of the groove GV may not be smooth and may have a step difference such as a stair shape.

The connection wiring CWL may be arranged inside the groove GV. The first organic insulating layer 121 may cover the connection wiring CWL and fill the groove GV. The connection wiring CWL may be arranged between the buffer layer 111 and the first organic insulating layer 121 in the second display area DA2. In an embodiment, the connection wiring CWL and the first source electrode SE1 and/or the first drain electrode DE1 may be formed by a same process, and thus the groove GV may be formed before the connection wiring CWL.

Figure 11:
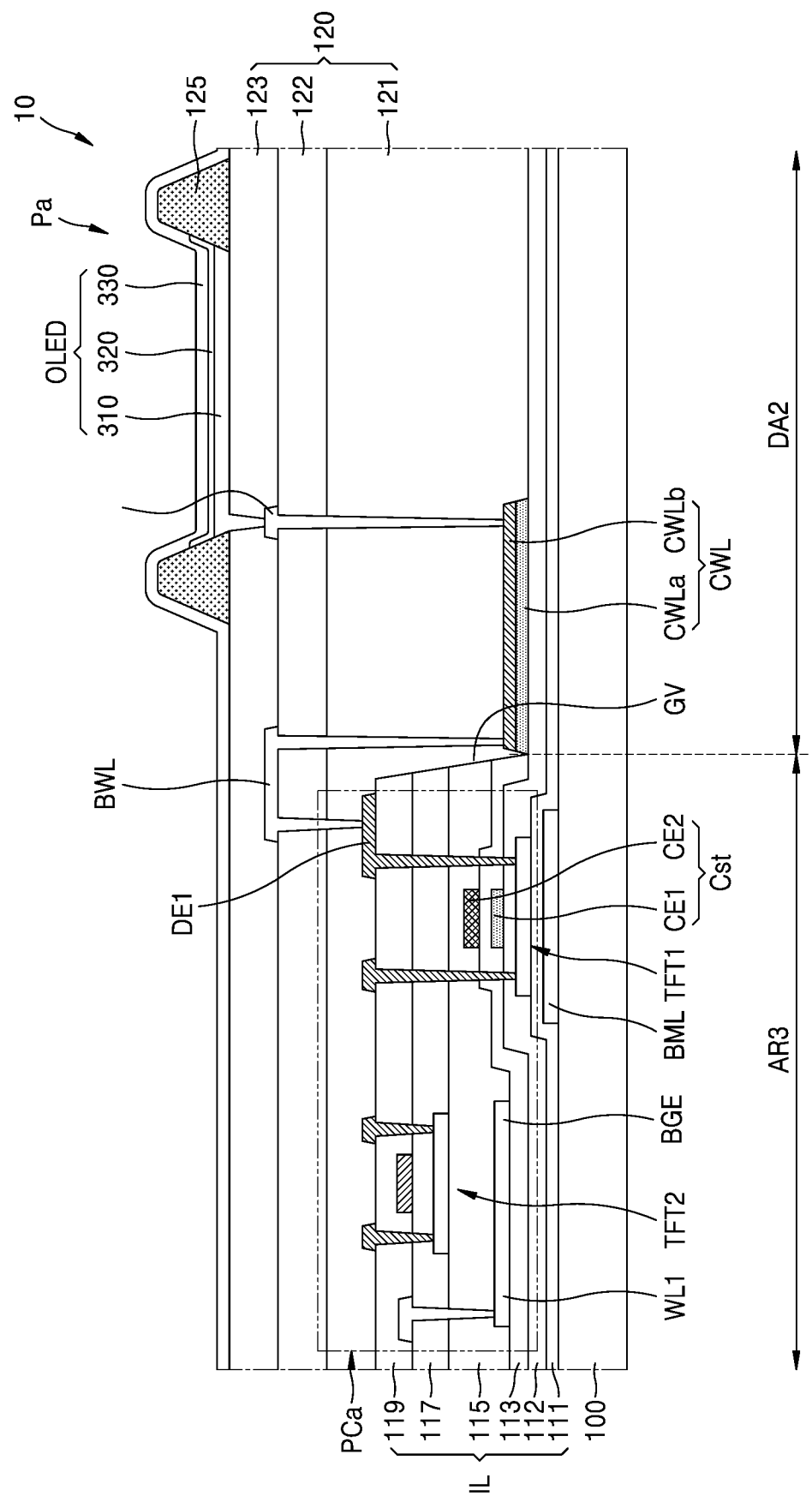
FIG. 11 is a schematic cross-sectional view of a portion of a display panel according to an embodiment.

Referring to FIG. 11, the connection wiring CWL may include a first conductive layer CWLa and a second conductive layer CWLb that are stacked, the first conductive layer CWLa and the first gate electrode GE1 of the first thin-film transistor TFT1 may include a same layer, and the second conductive layer CWLb and the first source electrode SE1 and/or the first drain electrode DE1 of the first thin-film transistor TFT1 may include a same material. The connection wiring CWL may include metal such as molybdenum (Mo), aluminum (Al), copper (Cu), titanium (Ti), and the like and include a single layer or a multi-layer. The first conductive layer CWLa of the connection wiring CWL and the first gate electrode GE1 may be simultaneously formed by a same process. The second conductive layer CWLb of the connection wiring CWL and the first source electrode SE1 and/or the first drain electrode DE1 may be simultaneously formed by a same process.

The groove GV may be formed by removing a portion of the inorganic insulating layer IL. As an example, the buffer layer 111 and the first gate insulating layer 112 may be continuously arranged over the second display area DA2. The second gate insulating layer 113, the first interlayer insulating layer 115, the second interlayer insulating layer 117, and the third interlayer insulating layer 119 may respectively include openings corresponding to the second display area DA2. These openings may be respectively formed by separate processes or simultaneously formed by a same process. In case that these openings are formed by separate processes, the inner surface of the groove GV may not be smooth and may have a step difference such as a stair shape. The groove GV may be formed after the first conductive layer CWLa is formed. The second conductive layer CWLb may be formed after the groove GV is formed.

The first gate insulating layer 112 may cover the connection wiring CWL arranged inside the groove GV and fill the groove GV. The connection wiring CWL may be arranged between the first gate insulating layer 112 and the first organic insulating layer 121 in the second display area DA2.

Figure 12:
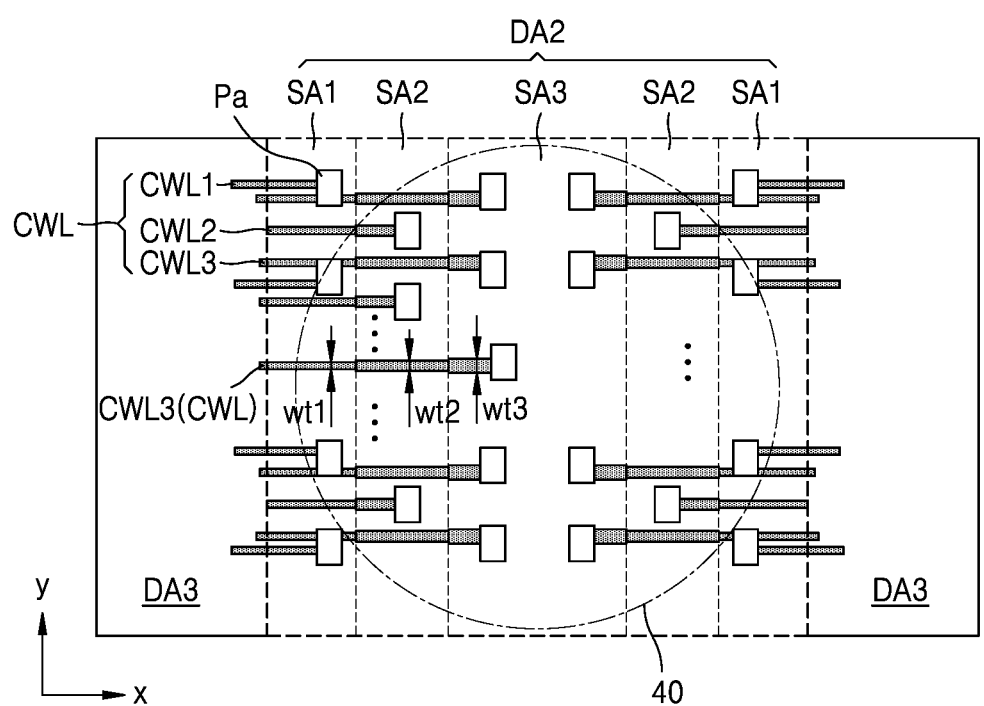
FIG. 12 is a schematic plan arrangement view of a portion of a display panel according to an embodiment.

FIG. 12 is a schematic plan arrangement view of a portion of the display panel 10 according to an embodiment. The second display area DA2 and the third display areas DA3 on two opposite sides of the second display area DA2 are shown.

Referring to FIG. 12, the second pixels Pa are arranged in the second display area DA2. The second pixels Pa may be arranged in various structures such as a PenTile™ structure, a stripe structure, a delta structure, and the like. The third display area DA3 may be arranged on the right side and the left side of the second display area DA2. The second pixel circuits PCa (see FIG. 4) may be arranged in the third display area DA3, and the second pixel circuit PCa may drive the second pixels Pa. The component 40 may be arranged to correspond to the second display area DA2.

Each of the second pixel circuits PCa in the third display area DA3 may be electrically connected to a display element implementing the second pixel Pa by the connection wiring CWL. The connection wiring CWL may extend in the x or a −x direction. As an example, the connection wiring CWL extending from the third display area DA3 on the left of the second display area DA2 to the second area DA2 may extend in the x direction, and the connection wiring CWL extending from the third display area DA3 on the right of the second display area DA2 to the second area DA2 may extend in the −x direction.

In the embodiment, the connection wiring CWL may include a portion having different widths depending on a location thereof arranged in the second display area DA2.

The second display area DA2 may include a first sub-area SA1, a second sub-area SA2, and a third sub-area SA3. The first sub-area SA1 may be a region arranged in the edge of the second display area DA2 adjacent to the third display area DA3. The third sub-area SA3 may be a region arranged in a central portion of the second display area DA2. The second sub-area SA2 may be a region arranged between the first sub-area SA1 and the third sub-area SA3.

Connection wirings CWL arranged in the second display area DA2 may include a first connection wiring CWL1, a second connection wiring CWL2, and a third connection wiring CWL3. The first connection wiring CWL1 may extend to the first sub-area SA1, the second connection wiring CWL2 may extend to the second sub-area SA2, and the third connection wiring CWL3 may extend to the third sub-area SA3.

In this case, all of the first connection wiring CWL1, the second connection wiring CWL2, and the third connection wiring CWL3 may be arranged in the first sub-area SA1. Only the first connection wiring CWL1, the second connection wiring CWL2 may be arranged in the second sub-area SA2. Only the third connection wiring CWL3 may be arranged in the third sub-area SA3.

In case that the first connection wiring CWL1, the second connection wiring CWL2, and the third connection wiring CWL3 each include opaque metal and are formed with a same thickness, light transmittances of the first sub-area SA1, the second sub-area SA2, and the third sub-area SA3 may be formed different, and thus, light or signal received/transmitted by the component 40 may not be uniform depending on the region (e.g., the first sub-area SA1, the second sub-area SA2, and the third sub-area SA3).

In the embodiment, the connection wiring CWL has different widths depending on a location thereof arranged in the second display area DA2, and thus, a light transmittance of the second display area DA2 may become uniform and the function of the component 40 may be improved.

The connection wiring CWL in the first sub-area SA1 may have a first width wt1, the connection wiring CWL in the second sub-area SA2 may have a second width wt2, and the connection wiring CWL in the third sub-area SA3 may have a third width wt3. The third width wt3 may be greater than the second width wt2. The second width wt2 may be greater than the first width wt1 (wt3>wt2>wt1). In this case, the first width wt1, the second width wt2, and the third width wt3 may be widths in a direction perpendicular to a direction in which the connection wiring CWL extends in the lengthwise direction. In an embodiment, the first width wt1 may be about 2 μm to about 2.5 μm, the second width wt2 may be about 2.5 μm to about 3 μm, and the third width wt3 may be about 3 μm to about 3.5 μm.

The first connection wiring CWL1 may be arranged only in the first sub-area SA1, and thus the first connection wiring CWL1 may be formed only with the first width wt1. The second connection wiring CWL2 may include a portion having the first width wt1 and a portion having the second width wt2. The third connection wiring CWL3 may include a portion having the first width wt1, a portion having the second width wt2, and a portion having the third width wt3.

Figure 13:
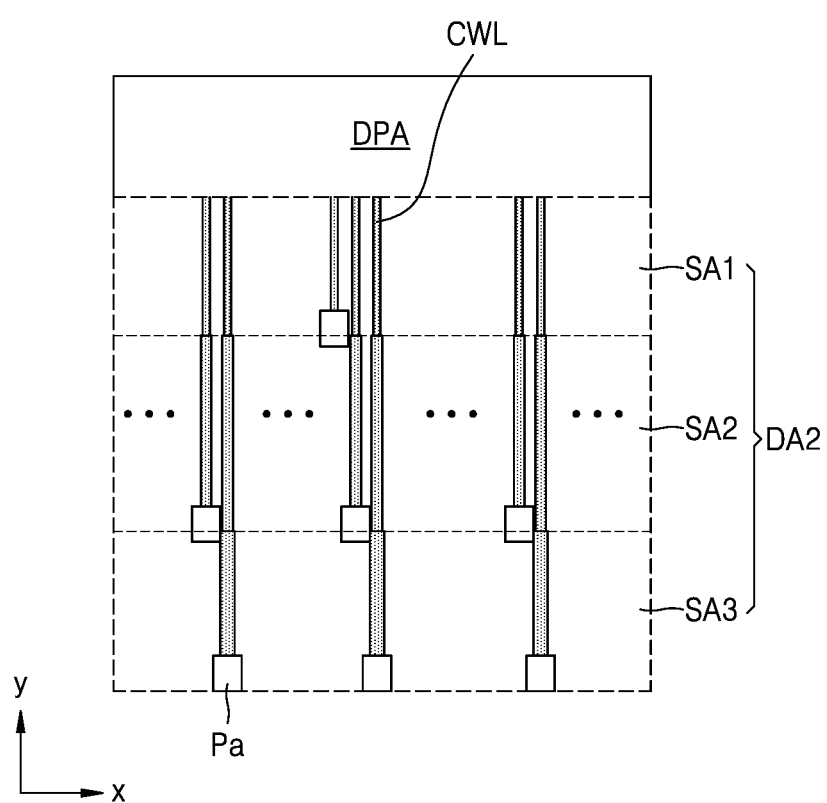
FIG. 13 is a schematic plan arrangement view of a portion of a display panel according to an embodiment.

FIG. 13 is a schematic plan arrangement view of a portion of the display panel 10 according to an embodiment. The second display area DA2 and the peripheral area DPA arranged on an upper side thereof are shown.

Referring to FIG. 13, the second pixels Pa are arranged in the second display area DA2. The peripheral area DPA may be arranged on the upper side of the second display area DA2. The second pixel circuits PCa (see FIG. 3) may be arranged in the peripheral area DPA, and the second pixel circuits PCa may drive the second pixels Pa.

Each of the second pixel circuits PCa in the peripheral area DPA may be electrically connected to a display element implementing the second pixel Pa by the connection wiring CWL. The connection wiring CWL may extend in a −z direction. In the embodiment, the connection wiring CWL may include a portion having different widths depending on a location thereof arranged in the second display area DA2.

The second display area DA2 may include a first sub-area SA1, a second sub-area SA2, and a third sub-area SA3. The first sub-area SA1 may be a region arranged in the edge of the second display area DA2 adjacent to the peripheral area DPA. The third sub-area SA3 may be spaced apart from the first sub-area SA1. The second sub-area SA2 may be a region arranged between the first sub-area SA1 and the third sub-area SA3.

Connection wirings CWL arranged in the second display area DA2 may include a first connection wiring CWL1, a second connection wiring CWL2, and a third connection wiring CWL3, the first connection wiring CWL1 may extend to the first sub-area SA1, the second connection wiring CWL2 may extend to the second sub-area SA2, and the third connection wiring CWL3 may extend to the third sub-area SA3.

The connection wiring CWL in the first sub-area SA1 may have a first width wt1, the connection wiring CWL in the second sub-area SA2 may have a second width wt2, and the connection wiring CWL in the third sub-area SA3 may have a third width wt3. The third width wt3 may be greater than the second width wt2. The second width wt2 may be greater than the first width wt1 (wt3>wt2>wt1). In this case, the first width wt1, the second width wt2, and the third width wt3 may be widths in a direction perpendicular to a direction in which the connection wiring CWL extends in the lengthwise direction. In an embodiment, the first width wt1 may be about 2 μm to about 2.5 μm, the second width wt2 may be about 2.5 μm to about 3 μm, and the third width wt3 may be about 3 μm to about 3.5 μm.

The first connection wiring CWL1 may be arranged only in the first sub-area SA1, and thus the first connection wiring CWL1 may be formed only with the first width wt1. The second connection wiring CWL2 may include a portion having the first width wt1 and a portion having the second width wt2. The third connection wiring CWL3 may include a portion having the first width wt1, a portion having the second width wt2, and a portion having the third width wt3.

Figure 14:
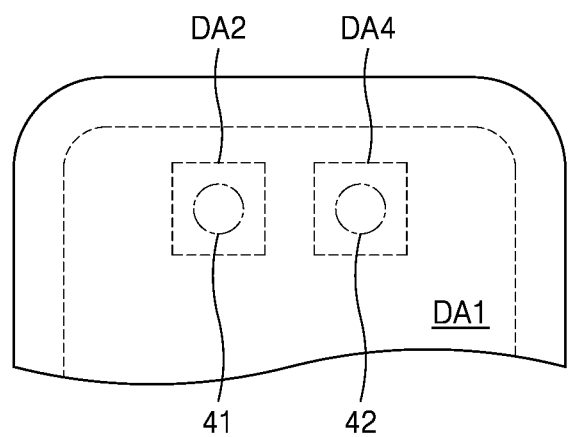
FIG. 14 is a schematic plan view of a portion of a display panel according to an embodiment.
Figure 15:
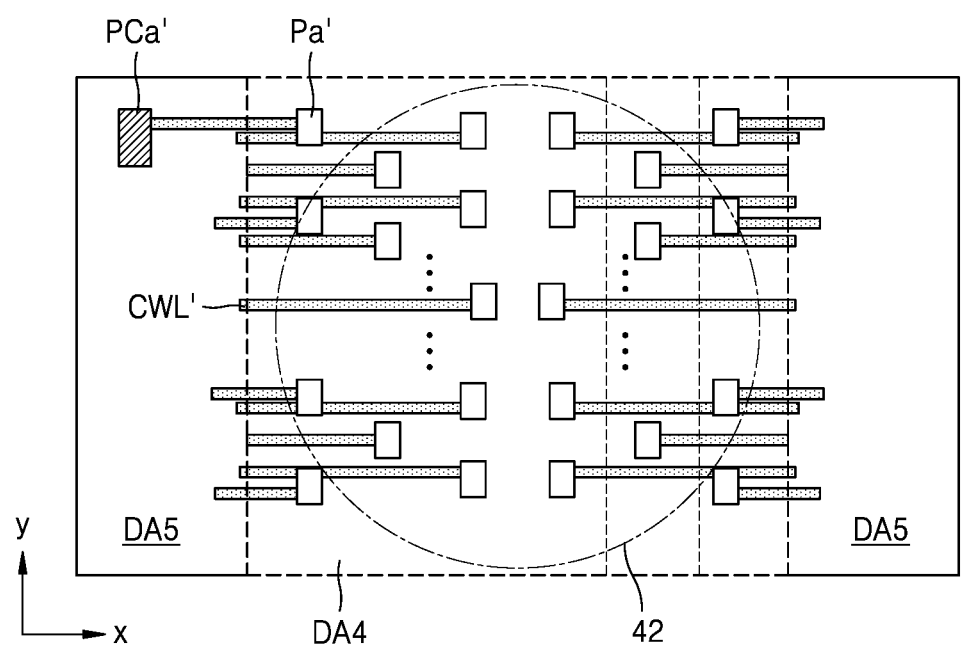
FIG. 15 is a schematic enlarged plan arrangement view of a partial region of FIG. 14.

FIG. 14 is a schematic plan view of a portion of the display panel according to an embodiment, and FIG. 15 is a schematic enlarged plan arrangement view of a partial region of FIG. 14. FIG. 15 illustrates a fourth display area of FIG. 14.

Referring to FIGS. 14 and 15, the display panel according to an embodiment includes the first display area DA1, the second display area DA2, and a fourth display area DA4. The fourth display area DA4 is spaced apart from the second display area DA2. The first display area DA1 may surround at least a portion of the fourth display area DA4. The first display area DA1 may be a main display area. The second display area DA2 and the fourth display area DA4 may be component areas in which the component is arranged and auxiliary display areas, simultaneously. For example, the first display area DA1, the second display area DA2, and the fourth display area DA4 may each display images individually or in combination with each other.

A first component 41 and a second component 42 may be respectively arranged below the display panel to correspond to the second display area DA2 and the fourth display area DA4. The function of the first component 41 may be different from the function of the second component 42. Light transmittances of the second display area DA2 and the fourth display area DA4 may be different from each other depending on the first component 41 and the second component 42. The description of the second display area DA2 is replaced by the description made with reference to FIG. 12.

Referring to FIG. 15, fourth pixels Pa' are arranged in the fourth display area DA4. A fourth pixel circuit PCa' may be arranged outside the fourth display area DA4, and the fourth pixel circuit PCa' may drive the fourth pixel Pa'. As an example, the fourth pixel circuit PCa' may be arranged in fifth display areas DA5 arranged on two opposite sides of the fourth display area DA4. Fifth pixels displaying images and fifth pixel circuits driving the fifth pixels may be arranged in the fifth display area DA5.

Each of the fourth pixel circuits PCa' in the fifth display area DA5 may be electrically connected to a display element implementing the fourth pixel Pa' by a connection wiring CWL'. The connection wiring CWL' may extend in the x or −x direction.

In the embodiment, the shape and/or material of the connection wiring CWL' in the fourth display area DA4 may be different from the shape and/or material of the connection wiring CWL in the second display area DA2 (see FIG. 12).

In an embodiment, the connection wiring CWL' in the fourth display area DA4 may be arranged with a constant width. The connection wiring CWL' may include opaque metal having a constant width, and thus even though a light transmittance thereof may not be uniform, in case that there is no problem in the performance of the second component 42, the connection wiring CWL' may be provided with a constant width. As another example, even though the connection wiring CWL' include portions having different widths, the connection wiring CWL' may be provided with a width different from that of the connection wiring CWL in the second display area DA2.

In an embodiment, the connection wiring CWL' in the fourth display area DA4 may include a transparent conductive material. As an example, the connection wiring CWL' may include a transparent conductive oxide (TCO). The connection wiring CWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). To make a light transmittance of the fourth display area DA4 greater than a light transmittance of the second display area DA2, the connection wiring CWL' in the fourth display area DA4 may include a transparent conductive material.

Figure 16:
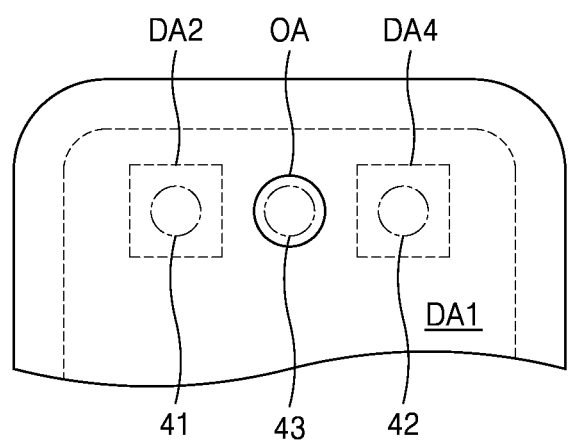
FIG. 16 is a schematic plan view of a portion of a display panel according to an embodiment.

FIG. 16 is a schematic plan view of a portion of the display panel according to an embodiment.

Referring to FIG. 16, the display panel may further include an opening area OA.

The opening area OA may be a region below which a third component 43 is arranged. The opening area OA may be understood as a transmission area through which light and/or sound output from the third component 43 to the outside or traveling toward the third component 43 from the outside may pass. In an embodiment, in case that light passes through the opening area OA, a light transmittance may be about 50% or more, more preferably about 70% or more, about 75% or more, about 80% or more, about 85% or more, or about 90% or more. The opening area OA is a region in which display elements are not arranged, and thus, a region that may not display images. In an embodiment, the opening area OA may be arranged inside the display area DA, and main pixels, for example, the first pixels Pm (see FIG. 1) may be arranged to surround the opening area OA.

The first component 41 and the second component 42 may be respectively arranged below the second display area DA2 and the fourth display area DA4. The pixels, for example, the second pixels Pa and the fourth pixels Pa' may be arranged in the second display area DA2 and the fourth display area DA4 to display images.

In an embodiment, a light transmittance of the opening area OA may be greater than light transmittances of the second display area DA2 and the fourth display area DA4. Accordingly, a component having a high light transmittance, for example, a camera, and the like may be arranged in the opening area OA. A sensor sensing an infrared ray or an illuminance sensor, and the like may be arranged in the second display area DA2 and the fourth display area DA4.

As described above, in the display panel and the display apparatus according to an embodiment, a pixel circuit may not be arranged in the second display area in which a component is arranged, and thus a wider transmission area may be secured, and a transmittance may be improved.

In addition, in the display panel and the display apparatus according to an embodiment, the connection wiring in the second display area may include metal and includes regions with different widths, and thus a voltage drop phenomenon may be reduced, and simultaneously, a uniform light transmittance may be secured.

However, the scope of the disclosure is not limited by these effects.

It should be understood that embodiments described herein should be considered in a descriptive sense only and not for purposes of limitation. Descriptions of features or aspects within each embodiment should be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display panel comprising:
    a substrate including:
        a first display area;
        a second display area;
        a first display element being arranged in the first display area; and
        a second display element being arranged in the second display area;
    a first pixel circuit arranged in the first display area and electrically connected to the first display element;

a second pixel circuit arranged outside the second display area and electrically connected to the second display element;

an inorganic insulating layer arranged over the substrate and including a groove corresponding to the second display area; and a connection wiring arranged inside the groove and electrically connecting the second display element to the second pixel circuit, wherein the connection wiring and at least one of conductive layers of the second pixel circuit include a same material, and the connection wiring includes portions having different widths depending on a position of the connection wiring arranged in the second display area.

2. The display panel of claim 1, further comprising:
an organic insulating layer arranged on the connection wiring and filling the groove.

3. The display panel of claim 1, wherein
the second pixel circuit includes a first thin-film transistor including:
  a first gate electrode; and
  a first semiconductor layer including a silicon semiconductor, and
the connection wiring and the first gate electrode are arranged on a same layer and include a same material.

4. The display panel of claim 1, wherein
the second pixel circuit includes:
  a first thin-film transistor including:
    a first gate electrode; and
    a first semiconductor layer including a silicon semiconductor; and
  a storage capacitor including a lower electrode and an upper electrode, the lower electrode and the first gate electrode being integral with each other, and the upper electrode being disposed over the lower electrode,
the connection wiring and the upper electrode include a same material and are arranged on a same layer.

5. The display panel of claim 1, wherein
the second pixel circuit includes:
  a first thin-film transistor including a first gate electrode and a first semiconductor layer including a silicon semiconductor; and
  a second thin-film transistor including a second gate electrode and a second semiconductor layer, the second gate electrode being arranged on a layer different from the first gate electrode, and the second semiconductor layer including an oxide semiconductor,
the connection wiring and the second gate electrode include a same material and are arranged on a same layer.

6. The display panel of claim 1, wherein
the second pixel circuit includes a first thin-film transistor including:
  a first gate electrode;
  a first source electrode;
  a first drain electrode; and
  a first semiconductor layer, the first semiconductor layer including a silicon semiconductor, and
the connection wiring and the first source electrode include a same material.

7. The display panel of claim 1, wherein
the second pixel circuit includes a first thin-film transistor including:
  a first gate electrode;
  a first source electrode;
  a first drain electrode; and
  a first semiconductor layer, the first semiconductor layer including a silicon semiconductor, and
the connection wiring includes a first conductive layer and a second conductive layer that are stacked,
the first conductive layer and the first gate electrode include a same material, and
the second conductive layer and the first source electrode include a same material.

8. The display panel of claim 1, wherein
the second display area includes:
  a first sub-area;
  a second sub-area; and
  a third sub-area, the first sub-area being arranged in an edge of the second display area, the third sub-area being spaced apart from the first sub-area, and the second sub-area being disposed between the first sub-area and the third sub-area,
a portion of the connection wiring arranged in the first sub-area has a first width,
a portion of the connection wiring arranged in the second sub-area has a second width,
a portion of the connection wiring arranged in the third sub-area has a third width,
the third width is greater than the second width, and
the second width is greater than the first width.

9. The display panel of claim 8, further comprising:
third display areas respectively arranged on a right side and a left side of the second display area, wherein
the second pixel circuit is arranged in the third display area, and
the connection wiring extends from the third display area to the second display area.

10. The display panel of claim 8, further comprising:
a peripheral area arranged over the second display area, wherein
the second pixel circuit is arranged in the peripheral area, and
the connection wiring extends from the peripheral area to the second display area.

11. The display panel of claim 1, wherein
the substrate further includes a fourth display area spaced apart from the second display area and in which a fourth display element is arranged,
the display panel further includes:
  a fourth pixel circuit arranged outside the fourth display area and electrically connected to the fourth display element; and
  an additional connection wiring electrically connecting the fourth display element to the fourth pixel circuit, and
the additional connection wiring is different from the connection wiring in at least one of a shape and a material.

12. The display panel of claim 11, wherein a width of the additional connection wiring is constant in the fourth display area.

13. The display panel of claim 1, wherein
the substrate further includes an opening area arranged inside the first display area, and
the opening area does not display an image.

14. A display apparatus comprising:
a display panel including:
  a first display area;
  a second display area;

a first display element being arranged in the first display area; and
a second display element being arranged in the second display area; and
a component arranged below the display panel to correspond to the second display area, wherein
the display panel includes:
a substrate;
a first pixel circuit arranged in the first display area and electrically connected to the first display element;
a second pixel circuit arranged outside the second display area and electrically connected to the second display element;
an inorganic insulating layer arranged over the substrate and including a groove corresponding to the second display area; and
a connection wiring arranged inside the groove and electrically connecting the second display element to the second pixel circuit,
the connection wiring and at least one of conductive layers of the second pixel circuit include a same material, and
the connection wiring includes portions having different widths depending on a position of the connection wiring arranged in the second display area.

15. The display apparatus of claim 14, further comprising:
an organic insulating layer arranged on the connection wiring and filling the groove.

16. The display apparatus of claim 14, wherein
the second pixel circuit includes a thin-film transistor including:
a gate electrode; and
a semiconductor layer, the semiconductor layer including a silicon semiconductor, and
the connection wiring and the gate electrode are arranged on a same layer and include a same material.

17. The display apparatus of claim 14, wherein
the second pixel circuit includes:
a thin-film transistor including a gate electrode;
a source electrode;
a drain electrode; and
a semiconductor layer, the semiconductor layer including a silicon semiconductor, and
the connection wiring includes a first conductive layer and a second conductive layer that are stacked,
the first conductive layer and the gate electrode include a same material, and
the second conductive layer and the source electrode include a same material.

18. The display apparatus of claim 14, wherein
the second display area includes:
a first sub-area;
a second sub-area; and
a third sub-area, the first sub-area being arranged in an edge of the second display area, the third sub-area being spaced apart from the first sub-area, and the second sub-area being disposed between the first sub-area and the third sub-area, and
a portion of the connection wiring arranged in the first sub-area has a first width,
a portion of the connection wiring arranged in the second sub-area has a second width,
a portion of the connection wiring arranged in the third sub-area has a third width,
the third width is greater than the second width, and
the second width is greater than the first width.

19. The display apparatus of claim 14, wherein
the display panel further includes:
a fourth display area spaced apart from the second display area; and
an additional component arranged below the display panel to correspond to the fourth display area, and
an additional connection wiring arranged in the fourth display area is different from the connection wiring in at least one of a shape and a material.

20. The display apparatus of claim 19, wherein a width of the additional connection wiring is constant in the fourth display area.

* * * * *